US012585837B2

(12) United States Patent
Jenks et al.

(10) Patent No.: US 12,585,837 B2
(45) Date of Patent: Mar. 24, 2026

(54) DETERMINING 3D STRUCTURE FEATURES FROM DSM DATA

(71) Applicant: Zesty.ai, Inc., Oakland, CA (US)

(72) Inventors: Penn T. Jenks, Pacifica, CA (US); Masoumeh Rezaei Abkenar, Brossard (CA); Bryan Michael Minor, Dollard-des-Ormeaux (CA); Michael Ulin, Sacramento, CA (US)

(73) Assignee: Zesty.ai, Inc., San Francisco, CA (US)

( * ) Notice: Subject to any disclaimer, the term of this patent is extended or adjusted under 35 U.S.C. 154(b) by 1037 days.

(21) Appl. No.: 17/546,721

(22) Filed: Dec. 9, 2021

(65) Prior Publication Data

US 2022/0180016 A1     Jun. 9, 2022

Related U.S. Application Data

(60) Provisional application No. 63/219,624, filed on Jul. 8, 2021, provisional application No. 63/123,209, filed on Dec. 9, 2020.

(51) Int. Cl.
| *G06F 30/13* | (2020.01) |
| *G06F 30/27* | (2020.01) |
| *G06T 17/20* | (2006.01) |
| *G06V 10/40* | (2022.01) |

(52) U.S. Cl.
CPC .............. *G06F 30/13* (2020.01); *G06F 30/27* (2020.01); *G06T 17/20* (2013.01); *G06V 10/40* (2022.01)

(58) Field of Classification Search
CPC ......... G06F 30/13; G06F 30/27; G06V 10/40; G06T 17/20
See application file for complete search history.

(56) References Cited

U.S. PATENT DOCUMENTS

| 4,550,376 | A | 10/1985 | Maciejczak |
| 5,742,335 | A | 4/1998 | Cannon |
| 5,794,216 | A | 8/1998 | Brown |
| 7,958,034 | B2 | 6/2011 | Ehrhart |
| 8,078,436 | B2 | 12/2011 | Pershing et al. |
| 8,081,795 | B2 | 12/2011 | Brown |

(Continued)

FOREIGN PATENT DOCUMENTS

| CN | 201620636 | U | 11/2010 |
| WO | 20056446 | A1 | 3/2020 |

OTHER PUBLICATIONS

Fatemeh Alidoost, NPL, 2D Image-To-3D Model: Knowledge-Based 3D Building Reconstruction (3DBR) Using Single Aerial Images and Convolutional Neural Networks (CNNs), Sep. 23, 2019 (Year: 2019).*

(Continued)

*Primary Examiner* — Rehana Perveen
*Assistant Examiner* — Angel Calle
(74) *Attorney, Agent, or Firm* — Patent Law Works LLP

(57) ABSTRACT

The disclosure includes a system and method for determining a three-dimensional (3D) structure from an image including receiving, using one or more processors, a digital surface model (DSM) image; receiving, using the one or more processors, a non-DSM image; outlining, using the one or more processors, a structure in the non-DSM image; and determining, using the one or more processors, a set of features based on the DSM image.

24 Claims, 17 Drawing Sheets

508a

DETERMINE 3D POINT FOR EACH ELEVATION VALUE IN DSM IMAGE
602

DIVIDE IMAGE INTO M PATCHES
604

FOR EACH PATCH, DECOMPOSE COVARIANCE MATRIX TO OBTAIN PRINCIPAL COMPONENTS INCLUDING EIGEN VECTORS AND EIGEN VALUES
606

REMOVE OUTLIER POINTS BASED ON VARIANCE
608

IDENTIFY EDGE POINTS BASED ON EIGEN VALUES
610

GROW SURFACE REGION(S) BASED ON NORMAL VECTOR SIMILARITY 612

MERGE NEIGHBORING COPLANAR REGIONS
614

(56) References Cited

U.S. PATENT DOCUMENTS

| | | | |
|---|---|---|---|
| 8,170,840 | B2 | 5/2012 | Pershing |
| 8,209,152 | B2 | 6/2012 | Pershing |
| 8,280,633 | B1 | 10/2012 | Eldering |
| 8,289,160 | B1 | 10/2012 | Billman |
| 8,497,905 | B2 | 7/2013 | Nixon |
| 8,542,880 | B2 | 9/2013 | Thornberry et al. |
| 8,774,525 | B2 | 7/2014 | Pershing |
| 8,775,219 | B2 | 7/2014 | Swanson et al. |
| 8,818,770 | B2 | 8/2014 | Pershing |
| 8,823,732 | B2 | 9/2014 | Adams et al. |
| 8,825,454 | B2 | 9/2014 | Pershing |
| 9,046,759 | B1 | 6/2015 | Tarlinton |
| 9,147,287 | B2 | 9/2015 | Ciarcia |
| 9,489,397 | B1 | 11/2016 | Olson |
| 9,536,148 | B2 | 1/2017 | Gross |
| 9,542,417 | B2 | 1/2017 | Hieronymus et al. |
| 9,648,355 | B2 | 5/2017 | Roskowski |
| 9,721,400 | B1 | 8/2017 | Oakes, III |
| 9,824,290 | B2 | 11/2017 | Millin et al. |
| 9,875,509 | B1 | 1/2018 | Harvey et al. |
| 9,911,228 | B2 | 3/2018 | Pershing et al. |
| 9,959,581 | B2 | 5/2018 | Pershing |
| 10,025,989 | B2 | 7/2018 | Drako |
| 10,083,616 | B2 | 9/2018 | Bauer |
| 10,102,586 | B1 | 10/2018 | Marlow et al. |
| 10,127,440 | B1 | 11/2018 | Drako |
| 10,134,092 | B1 | 11/2018 | Harvey et al. |
| 10,311,302 | B2 | 6/2019 | Kottenstette et al. |
| 10,387,582 | B2 | 8/2019 | Lewis et al. |
| 10,440,229 | B2 | 10/2019 | Drako |
| 10,453,147 | B1 | 10/2019 | Davis |
| 10,503,843 | B2 | 12/2019 | Keane |
| 10,505,923 | B2 | 12/2019 | Drako et al. |
| 10,529,029 | B2 | 1/2020 | Okazaki |
| 10,534,784 | B2 | 1/2020 | Cousins et al. |
| 10,650,285 | B1 | 5/2020 | Okazaki |
| 10,671,648 | B2 | 6/2020 | Barrow et al. |
| 10,740,684 | B1 | 8/2020 | Wani |
| 10,755,357 | B1 | 8/2020 | Davis |
| 10,915,829 | B1 | 2/2021 | Wani |
| 10,977,490 | B1 | 4/2021 | Bokshi-Drotar |
| 11,030,491 | B2 | 6/2021 | Okazaki |
| 11,131,597 | B1 | 9/2021 | Oakes, III |
| 11,195,058 | B2 | 12/2021 | Okazaki |
| 11,347,976 | B2 | 5/2022 | Okazaki |
| 11,488,255 | B1 | 11/2022 | Mast |
| 11,551,040 | B2 | 1/2023 | Okazaki |
| 11,593,887 | B1 | 2/2023 | Gaudin |
| 11,922,284 | B1 | 3/2024 | Pirozzi |
| 12,093,869 | B1 | 9/2024 | Kownacki |
| 2008/0208637 | A1 | 8/2008 | McKay et al. |
| 2010/0034483 | A1 | 2/2010 | Giuffrida et al. |
| 2011/0031309 | A1 | 2/2011 | Duhaime et al. |
| 2011/0033110 | A1 | 2/2011 | Shimamura et al. |
| 2011/0064308 | A1 | 3/2011 | Stein et al. |
| 2013/0060600 | A1 | 3/2013 | Schoolman |
| 2013/0226667 | A1 | 8/2013 | Terrazas et al. |
| 2013/0262029 | A1 | 10/2013 | Pershing |
| 2013/0321392 | A1* | 12/2013 | van der Merwe ... G06V 20/176 |
| | | | 345/419 |
| 2014/0132409 | A1 | 5/2014 | Billman et al. |
| 2015/0120332 | A1 | 4/2015 | Mildenhall et al. |
| 2015/0120333 | A1 | 4/2015 | Fiete et al. |
| 2015/0186953 | A1 | 7/2015 | Gross |
| 2015/0193881 | A1 | 7/2015 | Emison |
| 2015/0228031 | A1 | 8/2015 | Emison et al. |
| 2015/0235322 | A1 | 8/2015 | Emison |
| 2015/0254555 | A1 | 9/2015 | Williams, Jr. et al. |
| 2015/0302529 | A1 | 10/2015 | Jagannathan |
| 2015/0317740 | A1 | 11/2015 | Emison et al. |
| 2016/0004571 | A1 | 1/2016 | Smith |
| 2016/0048925 | A1 | 2/2016 | Emison et al. |
| 2016/0048934 | A1 | 2/2016 | Gross |
| 2016/0055594 | A1 | 2/2016 | Emison |
| 2016/0063516 | A1 | 3/2016 | Terrazas et al. |
| 2016/0360181 | A1 | 12/2016 | Drako |
| 2017/0039307 | A1 | 2/2017 | Koger |
| 2017/0076438 | A1 | 3/2017 | Kottenstette et al. |
| 2017/0084077 | A1 | 3/2017 | Liu et al. |
| 2017/0192424 | A1 | 7/2017 | Poole et al. |
| 2017/0228743 | A1 | 8/2017 | Cousins et al. |
| 2017/0352100 | A1 | 12/2017 | Shreve et al. |
| 2018/0089763 | A1 | 3/2018 | Okazaki |
| 2018/0201257 | A1 | 7/2018 | Dudar |
| 2018/0276527 | A1 | 9/2018 | Motoya |
| 2018/0292573 | A1 | 10/2018 | Cecelski et al. |
| 2018/0324595 | A1 | 11/2018 | Shima |
| 2018/0332004 | A1 | 11/2018 | Drako et al. |
| 2018/0336452 | A1 | 11/2018 | Tschernezki et al. |
| 2018/0348766 | A1 | 12/2018 | Lewis et al. |
| 2019/0064346 | A1 | 2/2019 | Jones et al. |
| 2019/0066217 | A1 | 2/2019 | Stoner, Jr. et al. |
| 2019/0088032 | A1 | 3/2019 | Milbert et al. |
| 2019/0114717 | A1 | 4/2019 | Labrie |
| 2019/0138849 | A1* | 5/2019 | Zhang .................. G06F 18/214 |
| 2019/0147247 | A1 | 5/2019 | Harris et al. |
| 2019/0147749 | A1 | 5/2019 | Lewis et al. |
| 2019/0162875 | A1 | 5/2019 | Cousins et al. |
| 2019/0188516 | A1 | 6/2019 | Porter et al. |
| 2019/0197311 | A1 | 6/2019 | Sun et al. |
| 2019/0228251 | A1 | 7/2019 | Melendez et al. |
| 2019/0228362 | A1 | 7/2019 | Anagnostou et al. |
| 2019/0228477 | A1 | 7/2019 | Carter et al. |
| 2019/0251397 | A1 | 8/2019 | Tremblay et al. |
| 2019/0295328 | A1 | 9/2019 | Martin de los Santos |
| 2019/0304026 | A1 | 10/2019 | Lyman et al. |
| 2019/0318440 | A1 | 10/2019 | Wani et al. |
| 2019/0370894 | A1 | 12/2019 | Meyers |
| 2019/0378216 | A1 | 12/2019 | Fiete et al. |
| 2019/0384866 | A1 | 12/2019 | Porter et al. |
| 2019/0385363 | A1 | 12/2019 | Porter et al. |
| 2020/0004901 | A1 | 1/2020 | Esteban |
| 2020/0005075 | A1 | 1/2020 | Porter et al. |
| 2020/0005536 | A1 | 1/2020 | Esteban et al. |
| 2020/0082168 | A1 | 3/2020 | Fathi et al. |
| 2020/0082615 | A1 | 3/2020 | Reed et al. |
| 2020/0098130 | A1 | 3/2020 | Porter et al. |
| 2020/0098170 | A1 | 3/2020 | Sehgal et al. |
| 2020/0100066 | A1 | 3/2020 | Lewis et al. |
| 2020/0110972 | A1 | 4/2020 | Esteban et al. |
| 2020/0117959 | A1* | 4/2020 | Sargent .................... G06T 7/10 |
| 2020/0134573 | A1 | 4/2020 | Vickers |
| 2020/0143212 | A1 | 5/2020 | Okazaki |
| 2020/0151500 | A1 | 5/2020 | Kossyk et al. |
| 2020/0159252 | A1 | 5/2020 | Giuffrida et al. |
| 2020/0160599 | A1 | 5/2020 | Nunez et al. |
| 2020/0167870 | A1 | 5/2020 | Isaacson et al. |
| 2021/0027532 | A1* | 1/2021 | Lin ........................ G06T 17/05 |
| 2021/0089839 | A1 | 3/2021 | Okazaki |
| 2021/0118117 | A1 | 4/2021 | Albrecht et al. |
| 2021/0133891 | A1 | 5/2021 | Jagannathan |
| 2021/0358049 | A1 | 11/2021 | Schwartz |
| 2021/0390624 | A1 | 12/2021 | Hayward |
| 2022/0051344 | A1 | 2/2022 | Dhuvur |
| 2023/0116402 | A1 | 4/2023 | Spader |
| 2024/0125971 | A1 | 4/2024 | Ulin |
| 2024/0127348 | A1 | 4/2024 | Ulin |
| 2024/0168198 | A1 | 5/2024 | Cook |

OTHER PUBLICATIONS

Tahmineh Partovi, NPL, "Automatic 3-D Building Model Reconstruction from Very High Resolution Stereo Satellite Imagery" Jul. 11, 2019 (Year: 2019).*

Jeremy Castagno, NPL, "Roof Shape Classification from LiDAR and Satellite Image Data Fusion Using Supervised Learning", Nov. 15, 2018 (Year: 2018).*

Mueller, M., et al., "Discrimination between roofing materials and streets within urban areas based on hyperspectral, shape, and context information," 2003 2nd GRSS/ISPRS Joint Workshop on Remote Sensing and Data Fusion over Urban Areas, 2003, pp. 196-200, doi: 10.1109/DFUA.2003.1219986. Abstract only. 2 pg.

(56) References Cited

OTHER PUBLICATIONS

Planning for Atmospheric Hazards and Disaster Management Under Changing Climate Conditions; 2006 IEEE EIC Climate Change Conference (pp. 1-9); H. Auld, D. MacIver, J. Klaassen, N. Comer, B. Tugwood; May 10, 2006. (Year: 2006).

Predicting Storm Outages Through New Representations of Weather and Vegetation; IEEE Access (vol. 7, 2019, pp. 29639-29654); Diego Cerrai, David W. Wanik, Md Abul Ehsan Bhuiyan, Xinxuan Zhang, Jaemo Yang, Maria E. B. Frediani, Emmanouil N. Anagnostou; Jan. 1, 2019. (Year: 2019).

Lall et al., The application of artificial neural networks for wildfire risk prediction; 2016 International Conference on Robotics and Automation for Humanitarian Applications (RAHA) (2016, pp. 1-6); Shruti Lall, Bonolo Mathibela; Dec. 18, 2016. (Year: 2016).

Tirone et al. A Machine Learning Approach to Improve the Usability of Severe Thunderstorm Wind Reports. Mar. 31, 2024 (Mar. 31, 2024). [retrieved on Sep. 15, 2025]. Retrieved from the Internet: <URL: https://journals.ametsoc.org/view/journals/bams/105/3/BAMS-D-22-0268.1.pdf>, pp. E623-E638.

PCT International Search Report and Written Opinion, International Application No. PCT/US25/39682 Zesty.AI, Inc., International filing date Jul. 29, 2025, date of mailing Sep. 22, 2025, 16 pgs.

* cited by examiner

508a

508b

RECEIVE DSM IMAGE
632

APPLY OBJECT DETECTION MODEL ON DSM IMAGE TO
APPLY BOUNDING BOX TO FEATURE(S) 634

SEGMENT DETECTED FEATURE FROM SURROUNDING IN
WITHIN BOUNDING BOX
636

OBTAIN OBJECT MASK
638

GENERATE 3D POLYGONS BY COMBINING MASK WITH
ELEVATIONS FROM DSM IMAGE 640

510

514

900

1100A

1100B

DETERMINING 3D STRUCTURE FEATURES FROM DSM DATA

CROSS-REFERENCE TO RELATED APPLICATIONS

The present application claims priority to U.S. Provisional Application No. 63/123,209, filed Dec. 9, 2020, titled "System and Method for Determining the 3D Shape of a Building from DSM Data" and to U.S. Provisional Application No. 63/219,624, filed Jul. 8, 2020, titled "System and Method for Determining the 3D Shape of a Building from DSM Data," the entirety of which are hereby incorporated by reference.

FIELD OF DISCLOSURE

The present disclosure relates generally to systems and methods for determining a three-dimensional (3D) structure from an image. More specifically, systems and methods for determining a 3D structure from a digital surface model image.

BACKGROUND

Insurance companies, construction contractors, real estate sales, and many others are very interested in knowing more about buildings. However, obtaining the desired information about the buildings using existing systems often requires an on-site presence to measure, calculate, or otherwise determine features of interest for a building.

SUMMARY

This specification relates to methods and systems for determining a three-dimensional (3D) structure from an image. In general, an innovative aspect of the subject matter described in this disclosure may be implemented in methods that include receiving, using one or more processors, a digital surface model (DSM) image; receiving, using the one or more processors, a non-DSM image; outlining, using the one or more processors, a structure in the non-DSM image; and determining, using the one or more processors, a set of features based on the DSM image.

Other implementations of one or more of these aspects include corresponding systems, apparatus, and computer programs, configured to perform the actions of the methods, encoded on computer storage devices.

These and other implementations may each optionally include one or more of the following features. Determining the set of features based on the DSM image applies a machine learning model to determine the set of features. The machine learning model is trained using simulated DSM image data, the simulated DSM image data generated from a three-dimensional simulation of a structure, vegetation, and a ground surface. The DSM image is selected from one or more of simulated DSM image, non-simulated DSM image, and a combination of simulated and non-simulated DSM data. Determining the set of features based on the DSM image applies a deep learning model trained on DSM images. Determining the set of features based on the DSM image further may include: applying an object detection model on the DSM image, the object detection model applying a bounding box to an instance of a feature; generating an object mask by segmenting the instance of the feature from its surrounding within the bounding box; and generating a three-dimensional polygon representing the instance of the feature by combining the object mask with elevation data from the DSM image. Determining, for each point within a set of points in the DSM image, a three-dimensional point; dividing the DSM image into a set of patches; for each patch in the set of patches, decomposing a covariance matrix to obtain a set of principal components, the set of principal components including a singular vector and a singular value; and growing a surface region based on merging a first neighboring region and a second neighboring region based on a similarity between a first normal vector associated with the first neighboring region and a second normal vector associated with the second neighboring region. The non-DSM image is a two-dimensional orthographic projection from a true nadir perspective and aligned with the DSM image. Outlining vegetation in the non-DSM image. Generating, using the non-DSM image and the DSM image, an outline of one or more structures in the non-DSM image; and generating, using the non-DSM image and the DSM image, an outline of vegetation in the non-DSM image. Optimizing a representation of the set of features including: determining a plane of best fit associated with a first feature, the set of features including a the first feature and a second feature; determining a line where the first feature intersects the second feature; simplifying a geometry at a point of multiple intersecting features; and trimming the set of features to remove a portion of a first feature extending beyond an outline of a first structure, the outline of the first structure included in the outline of one or more structures. The set of features includes a set of roof facets, the method may include: determining a set of metrics describing the set of roof facets, the set of metrics including one or more of a metric describing the set of roof facets and a metric describing an individual facet, where the metric describing the set of roof facets includes one or more of total number of roof facets, a total surface area of the roof, an average roof height, a number of stories, and a building footprint, and where the metric describing an individual facet includes one or more of a surface area associated with the individual facet and a roof pitch associated with the individual facet.

BRIEF DESCRIPTION OF THE DRAWINGS

The disclosure is illustrated by way of example, and not by way of limitation in the figures of the accompanying drawings in which like reference numerals are used to refer to similar elements.

DETAILED DESCRIPTION

The techniques introduced herein overcome the deficiencies and limitations of the prior art at least in part by providing systems and methods for determining a three-dimensional (3D) structure from an image. More specifically, systems and methods for determining a 3D structure from a digital surface model image.

Insurance companies, construction contractors, real estate sales, and many others are very interested in knowing more about buildings. For clarity and convenience, the description herein refers to examples in which the feature of interest is one or more roof facets and associated metrics. For example, in the context of a roof, insurance companies may want to know the size and shape/complexity of a building's roof to determine a replacement cost and/or an associated insurance premium, a pitch of the roof to determine risk of damage (e.g., from hail or snow load) and/or an associated insurance premium, etc. As another example, in the context of a roof, a roofing contractor may want to know about the total surface area and shape/complexity of the roof (e.g., a number and arrangement of roof facets) to generate an accurate bid. As yet another example, in the context of a roof, a solar contractor may want to know the roof facets (e.g., the south and west facing facets) including their surface area and roof pitch to determine a solar panel installation plan (e.g., a number of panels and their orientations) and estimate an amount of electricity to be generated from an installation.

This model specifically addresses building features that require 3D data for determination. By determining the number of roof facets, each being a planar surface (2D) and how they relate to each other in 3D Euclidean space ($\mathbb{R}$ 3), a complete understanding of the building roof is attained. Other building roof related features are then derivable from this facet data, such as maximum roof height, average roof pitch, and roof area.

While the present disclosure is described below primarily in the context of roof facets of buildings, it should be understood that other features and structures are within the scope of this disclosure.

Example System

Figure 1:
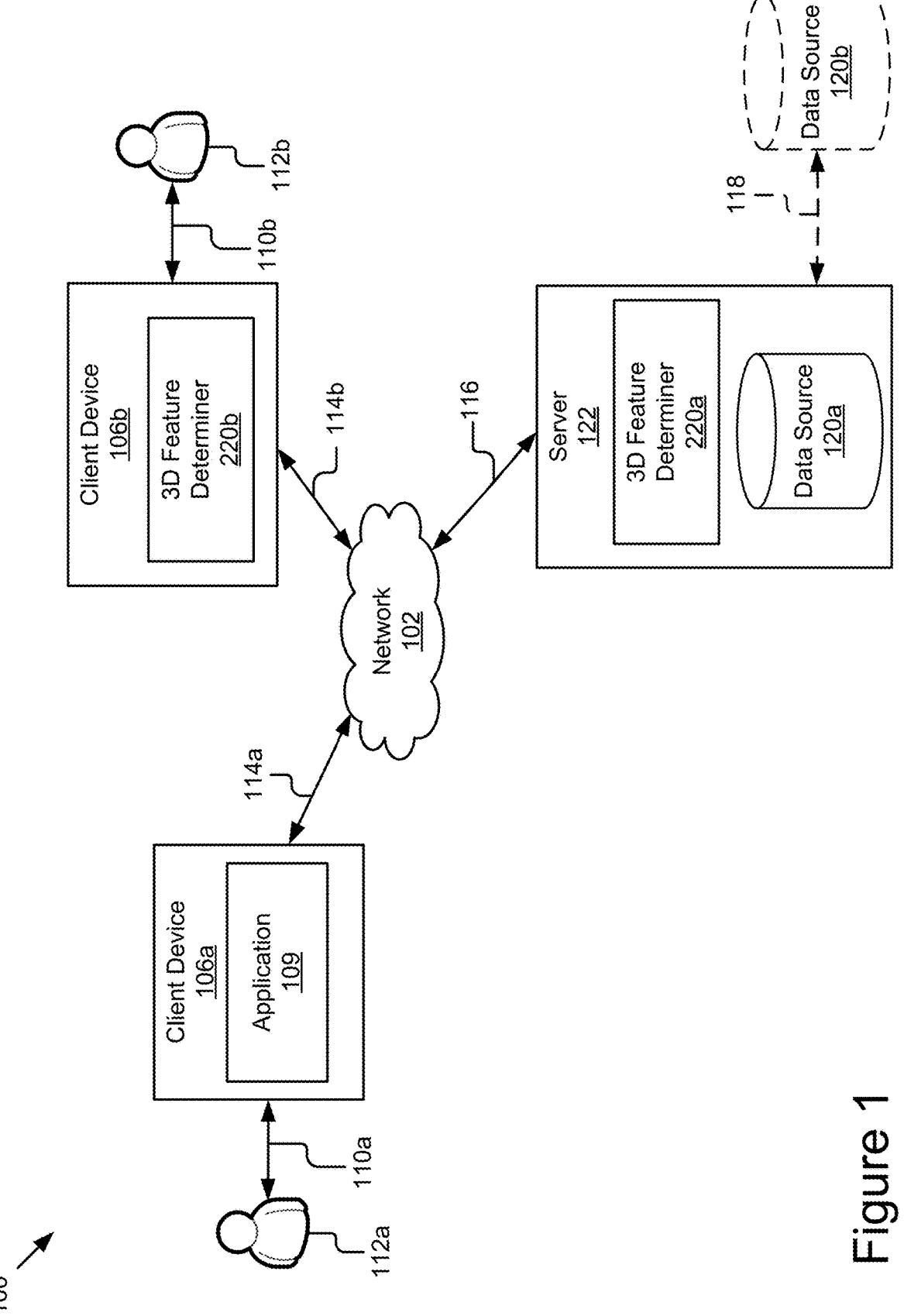
FIG. 1 is a block diagram of one example system for determining 3D building features from DSM data in accordance with some implementations.

FIG. 1 is a block diagram of one example system for determining 3D building features from DSM data in accordance with some implementations. As depicted, the system 100 includes a server 122 and client devices 106*a* and 106*b* coupled for electronic communication via a network 102. The client devices 106*a* or 106*b* may occasionally be referred to herein individually as a client device 106 or collectively as client devices 106. Although two client devices 106 are shown in FIG. 1, it should be understood that there may be any number of client devices 106.

A client device 106 is a computing device that includes a processor, a memory, and network communication capabilities (e.g., a communication unit). The client device 106 is coupled for electronic communication to the network 102 as illustrated by signal line 114. In some implementations, the client device 106 may send and receive data to and from other entities of the system 100 (e.g., a server 122). Examples of client devices 106 may include, but are not limited to, mobile phones (e.g., feature phones, smart phones, etc.), tablets, laptops, desktops, netbooks, portable media players, personal digital assistants, etc.

It should be understood that the system 100 depicted in FIG. 1 is provided by way of example and the system 100 and/or further systems contemplated by this present disclosure may include additional and/or fewer components, may combine components and/or divide one or more of the components into additional components, etc. For example, the system 100 may include any number of client devices 106, networks 102, or servers 122.

In some implementations, the client device 106 includes an application 109. Depending on the implementation, the application 109 may include a dedicated application or a browser (e.g., a web browser, such as Chrome, Firefox, Edge, Explorer, Safari, or Opera). In some implementations, a user 112 accesses the features and functionalities of the 3D feature determiner 220*a/b* via the application 109.

The network 102 may be a conventional type, wired and/or wireless, and may have numerous different configurations including a star configuration, token ring configuration, or other configurations. For example, the network 102 may include one or more local area networks (LAN), wide area networks (WAN) (e.g., the Internet), personal area networks (PAN), public networks, private networks, virtual networks, virtual private networks, peer-to-peer networks, near field networks (e.g., Bluetooth®, NFC, etc.), cellular (e.g., 4G or 5G), and/or other interconnected data paths across which multiple devices may communicate.

The server 122 is a computing device that includes a hardware and/or virtual server that includes a processor, a memory, and network communication capabilities (e.g., a communication unit). The server 122 may be communicatively coupled to the network 102, as indicated by signal line 116. In some implementations, the server 122 may send and receive data to and from other entities of the system 100 (e.g., one or more client devices 106). Some implementations for the server 122 are described in more detail below with reference to FIG. 2.

Data source 120*a* is a non-transitory memory that stores data for providing, at least in part, the functionality described herein. The data source 120*a/b* may include one or more non-transitory computer-readable mediums for storing the data. In some implementations, the data source 120*a* may be incorporated with the memory of the server 122 or the data source 120*b* may be distinct from the server 122 and coupled thereto. In some implementations, the data source 120 may be remote from the server 122, as illustrated by instance 120*b*. For example, in some implementations, (not shown) the data source 120*b* may include network accessible storage and/or one or more third party data sources that store and maintain data used to provide the functionality described herein.

The data source 120 may be a dynamic random-access memory (DRAM) device, a static random-access memory (SRAM) device, flash memory, or some other memory devices. In some implementations, the data source 120 may include a database management system (DBMS) operable on the server 122. For example, the DBMS could include a structured query language (SQL) DBMS, a NoSQL DMBS, various combinations thereof, etc. In some instances, the DBMS may store data in multi-dimensional tables comprised of rows and columns, and manipulate, e.g., insert, query, update and/or delete, rows of data using programmatic operations. In other implementations, the data source 120*a/b* also may include a non-volatile memory or similar permanent storage device and media including a hard disk drive, a CD-ROM device, a DVD-ROM device, a DVD-RAM device, a DVD-RW device, a flash memory device, or some other mass storage device for storing information on a more permanent basis.

The data source 120 stores data for providing, at least in part, the functionality described herein. The data may vary based on the implementation. Examples of data that the data source 120 may store include, but are not limited to, one or more of image data (e.g., DSM images, non-DSM images, etc.), machine learning models, simulations, etc.

Other variations and/or combinations are also possible and contemplated. It should be understood that the system 100 illustrated in FIG. 1 is representative of an example system and that a variety of different system environments and configurations are contemplated and are within the scope of the present disclosure. For example, various acts and/or functionality may be moved from a server to a client, or vice versa, data may be consolidated into a single data store or further segmented into additional data stores, and some implementations may include additional or fewer computing devices, services, and/or networks, and may implement various functionality client or server-side. Furthermore, various entities of the system may be integrated into a single computing device or system or divided into additional computing devices or systems, etc.

For example, depending on the implementation, the 3D feature determiner 220 may be entirely server-side, i.e., at 3D feature determiner 220*a*, entirely client-side, i.e., at 3D feature determiner 220*b*, or distributed to between the client-side and server side, i.e., across 3D feature determiner 220*a* and 3D feature determiner 220*b*.

As another example, while only a single server 122 is illustrated, the server 122 may represent a plurality of servers (e.g., a server farm or distributed, cloud environment), and the server 122, in some implementations, may, therefore, include multiple instances (e.g., in different hardware servers, virtual machines, or containers) of the 3D feature determiner 220*a*.

Figure 2:
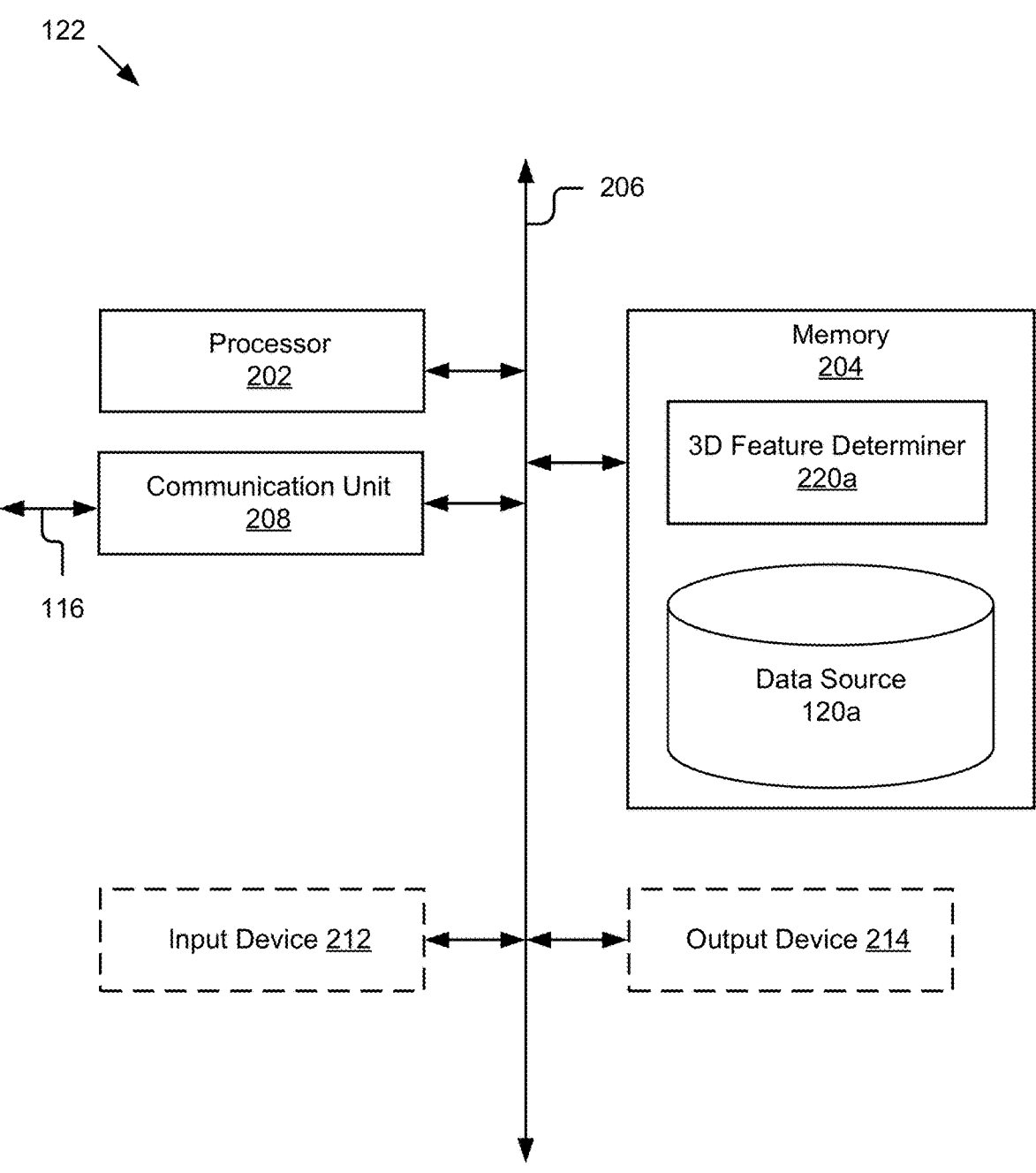
FIG. 2 is a block diagram of an example server in accordance with some implementations.

FIG. 2 is a block diagram of an example server 122 including an instance of the 3D feature determiner 220*a*. In the illustrated example, the example the server 122 includes a processor 202, a memory 204, a communication unit 208, and, optionally, a display device 210, and input device 212, and an output device 214.

The processor 202 may execute software instructions by performing various input/output, logical, and/or mathematical operations. The processor 202 may have various computing architectures to process data signals including, for example, a complex instruction set computer (CISC) architecture, a reduced instruction set computer (RISC) architecture, and/or an architecture implementing a combination of instruction sets. The processor 202 may be physical and/or virtual, and may include a single processing unit or a plurality of processing units and/or cores. In some implementations, the processor 202 may be capable of generating and providing electronic display signals to a display device, supporting the display of images, capturing and transmitting images, and performing complex tasks and determinations. In some implementations, the processor 202 may be coupled to the memory 204 via the bus 206 to access data and instructions therefrom and store data therein. The bus 206 may couple the processor 202 to the other components of the server 122 including, for example, the memory 204, the communication unit 208.

The memory 204 may store and provide access to data for the other components of the server 122. The memory 204 may be included in a single computing device or distributed among a plurality of computing devices. In some implementations, the memory 204 may store instructions and/or data that may be executed by the processor 202. The instructions and/or data may include code for performing the techniques described herein. For example, in some implementations, the memory 204 may store an instance of the 3D feature determiner 220*a*. The memory 204 is also capable of storing other instructions and data, including, for example, an operating system, hardware drivers, other software applications, databases, etc. The memory 204 may be coupled to the bus 206 for communication with the processor 202 and the other components of the server 122.

The memory 204 may include one or more non-transitory computer-usable (e.g., readable, writeable) device, a static random access memory (SRAM) device, a dynamic random access memory (DRAM) device, an embedded memory device, a discrete memory device (e.g., a PROM, FPROM, ROM), a hard disk drive, an optical disk drive (CD, DVD, Blu-ray™, etc.) mediums, which can be any tangible apparatus or device that can contain, store, communicate, or transport instructions, data, computer programs, software, code, routines, etc., for processing by or in connection with the processor 202. In some implementations, the memory 204 may include one or more of volatile memory and non-volatile memory. It should be understood that the memory 204 may be a single device or may include multiple types of devices and configurations.

The communication unit 208 is hardware for receiving and transmitting data by linking the processor 202 to the network 102 and other processing systems. The communication unit 208 receives data and transmits the data via the network 102. The communication unit 208 is coupled to the bus 206. In some implementations, the communication unit 208 may include a port for direct physical connection to the network 102 or to another communication channel. For example, the communication unit 208 may include an RJ45 port or similar port for wired communication with the network 102. In another implementation, the communication unit 208 may include a wireless transceiver (not shown) for exchanging data with the network 102 or any other communication channel using one or more wireless communication methods, such as IEEE 802.11, IEEE 802.16, Bluetooth® or another suitable wireless communication method.

In yet another implementation, the communication unit 208 may include a cellular communications transceiver for sending and receiving data over a cellular communications network such as via short messaging service (SMS), multimedia messaging service (MMS), hypertext transfer protocol (HTTP), direct data connection, WAP, e-mail or another suitable type of electronic communication. In still another implementation, the communication unit 208 may include a wired port and a wireless transceiver. The communication unit 208 also provides other connections to the network 102 for distribution of files and/or media objects using standard network protocols such as TCP/IP, HTTP, HTTPS, and SMTP as should be understood to those skilled in the art.

The input device 212 may include any device for inputting information into the server 122. In some implementations, the input device 212 may include one or more peripheral devices. For example, the input device 212 may include a keyboard, a pointing device, microphone, an image/video capture device (e.g., camera), a touch-screen display integrated with the output device 214, etc.

The output device 214 may be any device capable of outputting information from the server 122. The output device 214 may include one or more of a display (LCD, OLED, etc.), a printer, a 3D printer, a haptic device, audio reproduction device, touch-screen display, a remote computing device, etc. In some implementations, the output device 214 is a display which may display electronic images and data output by a processor for presentation to a user.

It should be apparent to one skilled in the art that other processors, operating systems, inputs (e.g., keyboard, mouse, one or more sensors, microphone, etc.), outputs (e.g., a speaker, display, haptic motor, etc.), and physical configurations are possible and within the scope of the disclosure.

Figure 3:
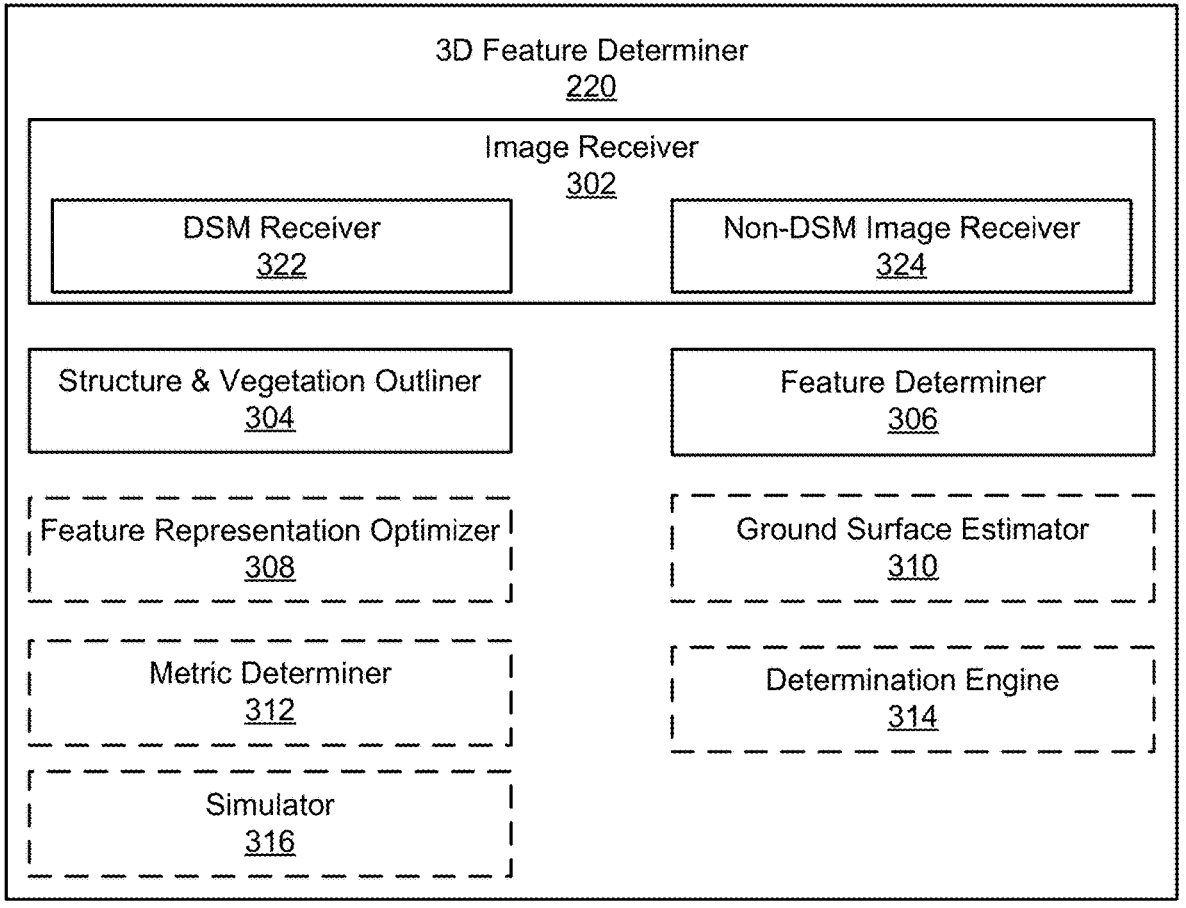
FIG. 3 is a block diagrams of an example 3D feature determiner in accordance with some implementations.

Referring now to FIG. 3, a block diagram of an example 3D feature determiner 220 is illustrated in accordance with some implementations. In the illustrated implementation of FIG. 3, the 3D feature determiner 220 includes an image receiver 302, a structure and vegetation outliner 304, and a feature determiner 306. In some implementations, the 3D feature determiner 220 may optionally include one or more of a feature representation optimizer 308, a ground surface estimator 310, a metric determiner 312, a determination engine 314, and a simulator 316. In the illustrated implementation, the image receiver 302 includes a DSM receiver 322 and a non-DSM image receiver 324.

In some implementations, one or more of the components 302, 304, 306, 308, 310, 312, 314, and 316, and the subcomponents 322 and 324, of the 3D feature determiner 220 may be communicatively coupled to one another to pass data and information to provide the features and functionality described below. In some implementations, one or more of the components 302, 304, 306, 308, 310, 312, 314, and 316, and the subcomponents 322 and 324, of the 3D feature determiner 220 may store the data and information to provide the features and functionality described below in memory 204 (or any other non-transitory storage medium communicatively accessible) for retrieval by one or more of the other components 302, 304, 306, 308, 310, 312, 314, and 316, and subcomponents 322 and 324, of the 3D feature determiner 220 by accessing the memory 204 (or other non-transitory storage medium).

The image receiver 302 receives images. Examples of images include, but are not limited to, training images and images on which feature determination is performed. In some implementations, the image receiver 302 receives a set of training images. In some implementations, the image receiver 302 receives an image used to perform 3D feature determination after training, during deployment of the 3D feature determiner 220.

In some implementations, the image receiver 302 includes a DSM receiver 322. The DSM receiver 322 receives a digital surface model (DSM) image. As used herein, a DSM is an elevation model that provides information on reflected surfaces, including but not limited to buildings, vegetation, and ground surfaces. A DSM image may capture both natural and built surfaces in contrast to a Digital Terrain Model (DTM) which provides information on bare earth surfaces without any objects such as vegetation and buildings. Depending on the implementation, the DSM image may be generated through techniques such as LiDAR (light detection and ranging) technology, photogrammetry, etc. In some implementations, the received DSM image is created through the technique of photogrammetry.

In some implementations, the DSM image of a structure, received by the DSM receiver 322, may be the only input containing 3D information used by the 3D feature determiner 220 to train the model(s) described below and/or perform the 3D feature determination described herein. In some implementations, the DSM is available as a one channel GeoTIFF with floating point values representing the elevation (Z) relative to the EGM2008 geoid location (X, Y). For example, referring now to FIG. 9, an example of a DSM image 900 is shown in accordance with some implementations.

Figure 9:
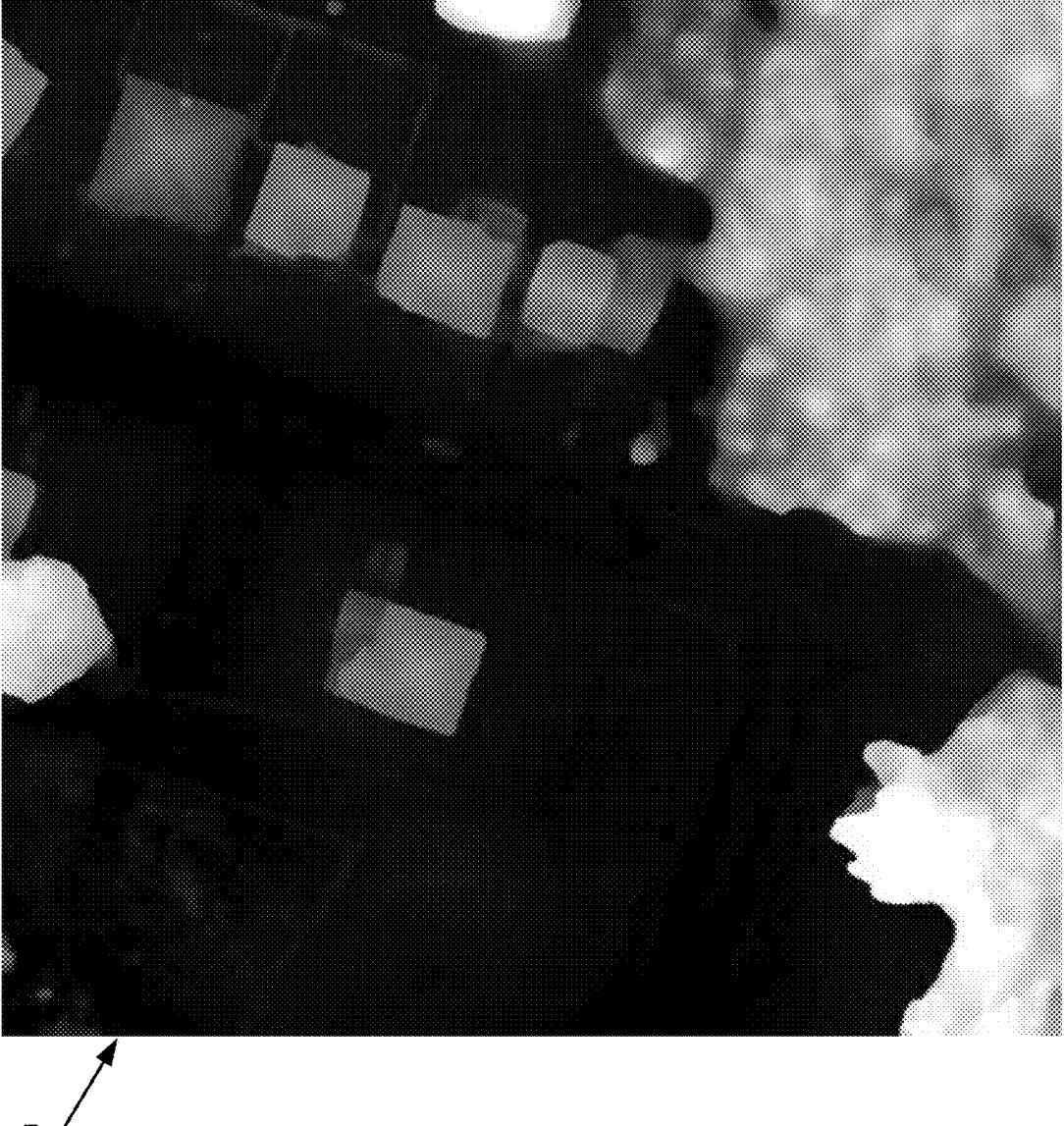
FIG. 9 is an example of a DSM image in accordance with some implementations.

In FIG. 9, the each of the structures in the example DSM image 900 are shown as grey in color, with the lighter grey shades at the ridge of their respective roofs. The trees that are taller than the buildings in the DSM are represented in a lighter shade of grey than the buildings. The tallest trees are represented in white. For clarity and convenience, it may be helpful to think of the DSM image depicting as for each X and Y location in a grid, a representative height Z (where the Z is represented in FIG. 9 by brightness, i.e., how dark, or light, the location is).

In some implementations, the image receiver 302 may receive more than one type of image. For example, in some implementations, the DSM receiver 322 of the image receiver 302 receives a DSM and a non-DSM image receiver 324 receives a non-DSM image. Examples of non-DSM images include aerial photographs, satellite photographs, etc. The non-DSM images may be RGB (red, green, and blue); CMYK (cyan, magenta, yellow, black) or use other color models.

In some implementations, the non-DSM image receiver 324 receives an two dimensional orthographic projection, such as ortho-normal 2D (RGB) raster image data. In some implementations, the orthographic projection is aligned with the DSM image and both are from a true nadir perspective. An ortho-normal 2D RGB raster image is an RGB aerial photograph or satellite imagery that is geometrically corrected ("orthorectified") such that the scale is uniform, i.e., the photo or image follows a given map projection. Unlike an uncorrected aerial photograph, an orthorectified image can be used to measure true distances, because it is an accurate representation of the Earth's surface, having been adjusted for topographic relief, lens distortion, and camera tilt.

In some implementations, a non-DSM image (e.g., aerial or satellite) may be orthorectified using a DSM or digital elevation model (DEM). As used herein, a DEM is an elevation surface representing the bare earth referenced to a common vertical datum. When the image is taken off-nadir a result of the orthorectification is that a side of a building becomes visible. Accordingly, when determining roof facets as features, it may be preferable to use an image and DSM taken from the true nadir perspective to avoid such artifacts.

Figure 10:
FIG. 10 is an example of a non-DSM image in accordance with some implementations.

In some implementations, the received DSM image(s) and non-DSM image(s) may be received from different data sets and the image receiver 302 may align the features (e.g., vegetation and structures) of the DSM and non-DSM images. In some implementations, the non-DSM image may be derived from the same dataset as the DSM, and thus is perfectly aligned with the DSM. For example, referring to FIG. 10, a non-DSM image 1000 in accordance with some implementations. FIG. 10 is a non-DSM image 1000 (an ortho-normal 2D RGB raster image, as depicted) of the same area represented in the DSM image 900 of FIG. 9.

In some implementations, the image receiver 302 passes images to the structure and vegetation outliner 304. Depending on the implementation, the images passed to the structure and vegetation outliner may include DSM images, non-DSM images, or both DSM images and non-DSM images. For example, the image receiver 302 is communicatively coupled to structure and vegetation outliner 304 to send the images. In another implementation, the image receiver 302 stores the non-DSM images in memory 204 (or any other non-transitory storage medium communicatively accessible, such as data source 120), and the structure and vegetation outliner 304 may retrieve the images by accessing the memory 204 (or other non-transitory storage medium).

In some implementations, the image receiver 302 passes DSM images to the feature determiner 306. For example, the image receiver 302 is communicatively coupled to feature determiner 306 to send the DSM images. In another implementation, the image receiver 302 stores the DSM images in memory 204 (or any other non-transitory storage medium communicatively accessible, such as data source 120), and the feature determiner 306 may retrieve the DSM images by accessing the memory 204 (or other non-transitory storage medium).

In some implementations, knowing which portions (e.g., which pixels) in an image belong to structures (e.g., buildings, houses, etc.) may be useful information for subsequent features and functionality. Similarly, in some implementations, knowing which portions in the image are associated with vegetation may be useful information for subsequent features and functionality.

The structure and vegetation outliner 304 generates outlines for structures and vegetation. In some implementations, the structure and vegetation outliner 304 generates the structure outline(s) and vegetation outline(s) by applying one or more machine learning models to generate the outlines. In some implementations, the structure and vegetation outliner 304 trains and applies a separate structure model to outline structures and vegetation model to outline vegetation. In some implementations, a single model may be trained and applied, by the structure and vegetation outliner 304, to outline vegetation and structures.

The varieties of supervised, semi-supervised, unsupervised, reinforcement learning, topic modeling, dimensionality reduction, meta-learning and deep learning machine learning algorithms, which may be used to generate the structure model and/or vegetation model described herein, are so numerous as to defy a complete list. Example algorithms include, but are not limited to, a decision tree; a gradient boosted tree, gradient boosted machine; boosted stumps; a random forest; a support vector machine; a neural network; logistic regression (with regularization), linear regression (with regularization); stacking; a Markov model; support vector machines; and others.

In some implementations, the structure and vegetation outliner 304 includes one or more trainers (not shown) to train the structure model and the vegetation model. Depending on the implementation, the structure model and the vegetation model may be based on the same, or a similar, type of algorithm or may be based on different algorithms or algorithm types. Depending on the implementation, training may include training of the algorithm(s) to create the feature learning model(s) 434, validation of the feature learning model(s) 434, or a combination of both.

In some implementations, the structure and vegetation outliner 304 receives labeled image data for training. In some implementations, the labeled image data includes human-applied outlines of structures and/or vegetation (e.g., on instances of actual, also referred to as non-simulated, images). In some implementations, the labeled image data includes computer-applied outlines of structures and/or vegetation, e.g., the labeled data is a simulated orthographic projection RGB raster (i.e., non-DSM image) and/or simulated DSM image data generated from a 3D computer simulation of vegetation and structures, and machine labeled, as the computer is aware which portions of the 3D computer simulation are vegetation and which are structures.

In some implementations, the structure and vegetation outliner 304 applies a supervised machine learning algorithm to train a structure model (e.g., using the structure outline labels) and a vegetation model (e.g., using the vegetation outline labels).

Figure 11A:
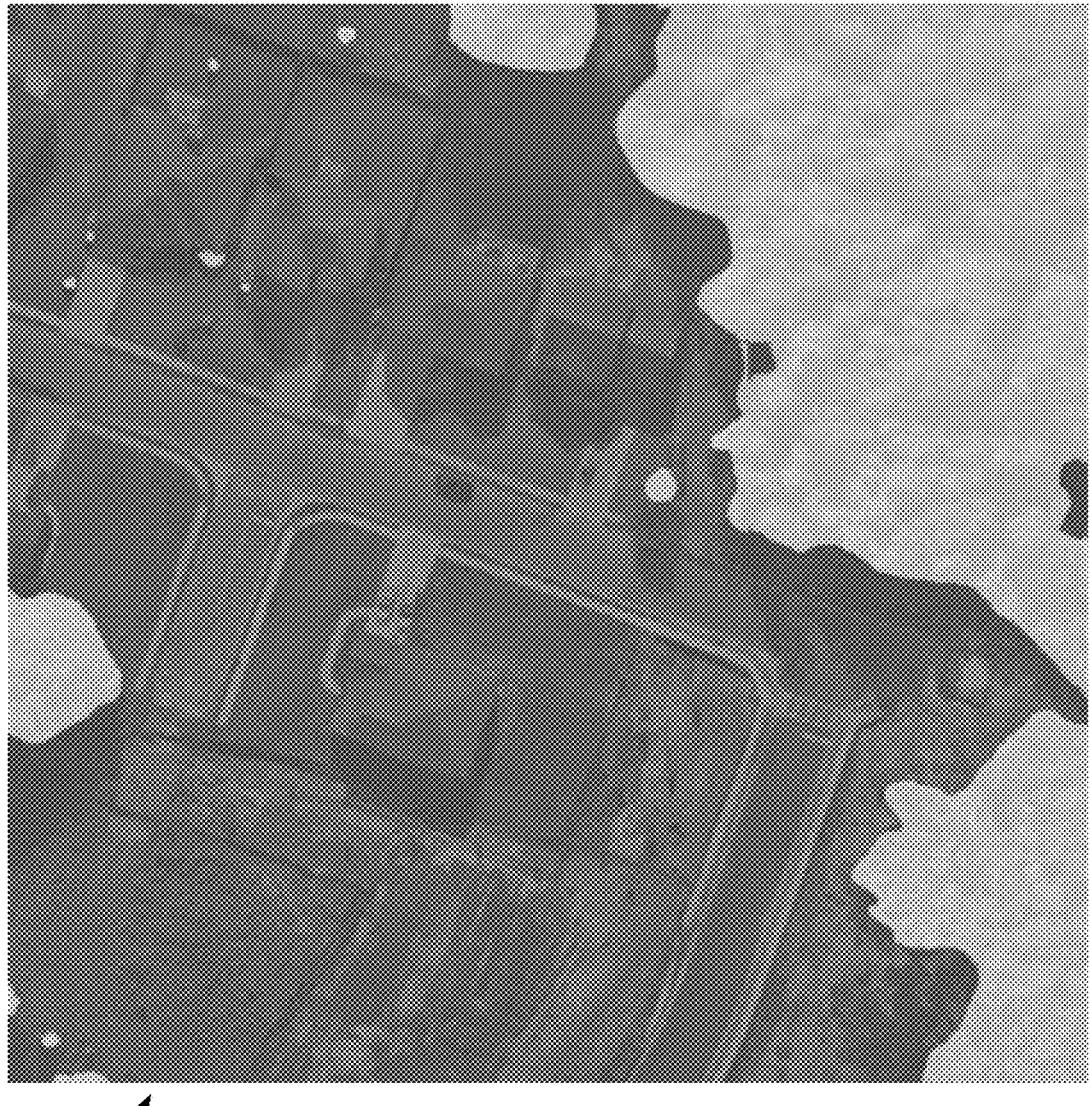
FIG. 11A illustrates an example of vegetation outlines in accordance with some implementations.
Figure 11B:
FIG. 11B illustrates an example of structure outlines in accordance with some implementations.

In some implementations, the structure and vegetation outliner 304 is trained on and applies the structure model and the vegetation model to a non-DSM image. For example, the structure and vegetation outliner 304 receives the non-DSM image 1000 of FIG. 10, applies a vegetation model to automatically outline the vegetation, which is outlined in the lighter portions of the vegetation-masked image 1100A of FIG. 11A, and applies a structure model to automatically outline the structures, which are outlined in the lighter portions of the structure-masked image 1100B of FIG. 11B.

In some implementations, the structure and vegetation outliner 304 is trained on and applies the structure model and the vegetation model to a DSM image. For example, the structure and vegetation outliner 304 receives the DSM image 900 of FIG. 9, applies a vegetation model to automatically outline the vegetation, which is outlined in the lighter portions of the vegetation-masked image 1100A of FIG. 11A, and applies a structure model to automatically outline the structures, which are outlined in the lighter portions of the structure-masked image 1100B of FIG. 11B.

In some implementations, the structure and vegetation outliner 304 is trained on a combination of non-DSM images and DSM images, and applies the structure model and the vegetation model to the DSM image, non-DSM image, or both depending on the specific implementation. For example, the structure and vegetation outliner 304 is trained on DSM images such as DSM image 900 of FIG. 9 and non-DSM images such as the non-DSM image 1000 of FIG. 10. In some implementations, when the structure and vegetation outliner 304 receives the DSM image and non-DSM image during implementation, also referred to as deployment, the structure and vegetation outliner 304 applies a vegetation model to the received DSM image (e.g. DSM image 900) and non-DSM image (e.g. non-DSM image 1000) to automatically generate an outline of the vegetation, which is outlined in the lighter portions of the vegetation-masked image 1100A of FIG. 11A, and applies a structure model to the received DSM image (e.g. DSM image 900) and non-DSM image (e.g. non-DSM image 1000) to automatically generate the outline of the structures, which are outlined in the lighter portions of the structure-masked image 1100B of FIG. 11B.

The feature determiner 306 receives a DSM image and determines a set of features from the DSM image. For clarity and convenience, the description herein refers to an example use case in which the feature is a roof facet, occasionally referred to herein as a "facet." However, it should be recognized that other features may be determined without departing from the description herein. A roof facet, as used herein, is a planar surface of a roof.

In some implementations, the feature determiner 306 may receive a minimum area (e.g., square footage), which may be hardcoded or user-customizable, and the feature determiner 306 does not output a facet that does not satisfy the minimum threshold.

In some implementations, the feature determiner 306 may apply a rule-based approach to determine the one or more features. For example, in some implementations, the feature determiner 306 of FIG. 3 is the rule-based feature determiner 306a of FIG. 4A. In some implementations, the feature determiner 306 may apply a machine learning based approach to determine the one or more features. For example, in some implementations, the feature determiner 306 of FIG. 3 is the machine learning based feature determiner 306b of FIG. 4B.

Figure 4A:
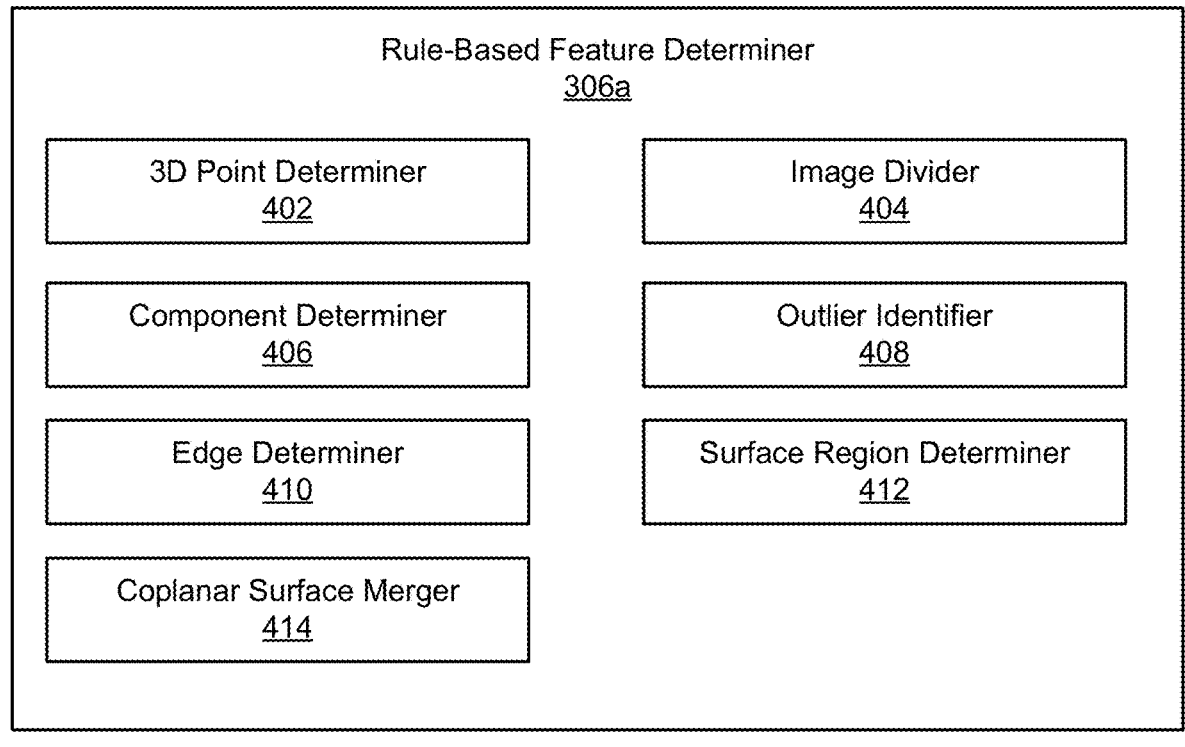
FIG. 4A is a block diagram of an example rule-based feature 3D determiner in accordance with some implementations.

Referring now to FIG. 4A, a block diagram of an example rule-based feature determiner 306a is illustrated in accordance with some implementations. In the illustrated implementation of FIG. 4A, the rule-based feature determiner 306a includes a 3D point determiner 402, an image divider 404, a component determiner 406, an outlier identifier, an edge determiner, a surface region determiner 412, and a coplanar surface merger 414.

In some implementations, the rule-based feature determiner 306a applies a rule-based facet segmentation to identify planar surfaces from a set of 3D point clouds data. Identifying the planar surfaces representing the facets is difficult because the points are usually unorganized, incomplete, noisy, sparse, have inconsistent point density, and in addition the surface shape is arbitrary. In some implementations, the rule-based feature determiner 306a applies a principal component analysis (PCA) based covariance technique to compute facet geometries. In some implementations, the rule-based feature determiner 306a does this by This is performed by determining the covariance matrix, C, for a local neighborhood surrounding the point of interest using Equation 1 where the entities in the covariance matrix for a neighborhood of size k is defined as Equation 2.

$$C = \begin{bmatrix} \sigma_x^2 & \sigma_{xy} & \sigma_{xz} \\ \sigma_{xy} & \sigma_y^2 & \sigma_{yz} \\ \sigma_{xz} & \sigma_{yz} & \sigma_z^2 \end{bmatrix} \qquad \text{Equation 1}$$

$$\sigma_x^2 = \text{var}(x) = \frac{1}{k}\sum\nolimits_{i=1}^{k}(x_i - \bar{x})^2 \qquad \text{Equation 2}$$

$$\sigma_{xy}^2 = \text{cov}(x, y) = \frac{1}{k}\sum\nolimits_{i=1}^{k}(x_i - \bar{x})(y_i - \bar{y})$$

The covariance matrix of each local neighborhood is decomposed into its principal components (e.g., singular vectors $v_i$, and singular values $\lambda_i$). It should be recognized that, while the description herein describes singular vectors and singular values, other vectors and values are within the scope of this disclosure. For example, eigen vectors and eigen values may be used without departing from the disclosure herein.

The principal components are ordered by decreasing singular values $\lambda_2 \geq \lambda_1 \geq \lambda_0 \geq 0$ with the corresponding singular vectors $v_2$, $v_1$, and $v_0$. The two singular vectors corresponding to the two largest singular values $\lambda_2$ and $\lambda_1$ approximates the surface tangent plane, while $v_0$ approximates the surface normal plane. In other words, the orientation of the vector perpendicular to the surface fitted to the local neighborhood may be approximated by the singular vector with the smallest singular value. The least singular value approximates the variation along the surface normal, which is an indicator of the quality of fit. Thus, the rule-based feature determiner 306a may determine whether the points are appropriately selected to generate the surface. In order to obtain more accurate facets, the generated surfaces are grown and merged based on their similarity and proximity to each other. Details of these processes are explained further below with reference to the components of rule-based feature determiner 306a.

In some implementations, one or more of the components 402, 404, 406, 408, 410, 412, and 414 of the rule-based feature determiner 306a may be communicatively coupled to one another to pass data and information and to provide the features and functionality described below. In some implementations, one or more of the components 402, 404, 406, 408, 410, 412, and 414 of the rule-based feature determiner 306a may store the data and information to provide the features and functionality described below in memory 204 (or any other non-transitory storage medium communicatively accessible) for retrieval by one or more of the other components 402, 404, 406, 408, 410, 412, and 414 of the rule-based feature determiner 306a by accessing the memory 204 (or other non-transitory storage medium).

The 3D point determiner 402 generates a 3D point for each elevation value from the DSM image. In some implementations, the 3D point determiner 402 receives a DSM image masked using the structure and vegetation outlines determined by the structure and vegetation outliner 304. For example, the 3D point determiner 402 for each pixel (X and Y coordinate) assigns a height, Z, based on a brightness of the pixel in the DSM image.

The image divider 404 divides the DSM image into a set of m patches, where m is a positive number, using a 2D kernel. For example, the image divider 404 divides the DSM image using a 2D kernel, where the 2D kernel is a 3×3 window of pixels spatially close in the xy-plane. It should be recognized that 3×3 is merely an example and that other dimensions may be used.

In some implementations, the component determiner 406 calculates principal components for each patch. The covariance matrix, C, for a point, $p_i=(x_i, y_i, z_i)(p_i \in \mathbb{R}^3)$ in a 3D cloud with its k neighbors is defined below in Equation 3.

$$C_{3\times3} = \frac{1}{k}\sum\nolimits_{i=1}^{k}(p_i - \bar{p})(p_i - \bar{p})^T, \; p = \frac{1}{k}\sum_{i=1}^{k}p_i \qquad \text{Equation 3}$$

The where $\bar{p}$ is the centroid of the local neighborhood. Decomposing covariance matrix, C, into its principal components (singular vectors $v_i$, and singular values $\lambda_i$) can define the local geometries of the underlying surface.

In some implementations, the component determiner 406 approximates the normal vector perpendicular to the plane fitted through the local set of points based on the singular vector, $v_0$, with the least singular value, $\lambda_0$. The least singular value, $\lambda_0$, is used to estimate the variance of the fit. For n points, there are n normal vectors and n variance scalars.

The outlier identifier 408 removes outlier points. In some implementations, the outlier identifier 408 removes outlier points based on their variance. For example, when the variance satisfies (e.g., exceeds) a predefined threshold, the point is removed from the set of points.

The edge determiner 410 determines points on an edge of a feature. In some implementations, points on the edge have a neighborhood from different adjacent surfaces and generally have larger values for $\lambda_0$. In some implementations, the edge determiner 410 applies Equation 4, below, to determine whether a point is an edge point.

$$\lambda_0 > mean(\lambda_0) + a \times std(\lambda_0) \qquad \text{Equation 4}$$

In Equation 4, a is a predefined parameter to tune the minimum number of standard deviations the variance of a point needs to be from the mean, to be considered part of the facet.

The surface region determiner 412 determines a region that includes points with similar normal values. For example, with the initial set of points, start with the point of least variance (i.e., the seed point). The normal vector at the seed point is compared to its k neighbors. When, the angle between the seed point's normal vector and its neighbor satisfies (e.g., is less than) a predefined threshold, the point is removed from the dataset and added to the current plane region. In some implementation, the surface region determiner 412 repeats this process in a depth-first search fashion, searching the neighbors of the added point. The region growth terminates when there are no further connected points that satisfy the angle threshold.

The coplanar surface merger 414 merges neighboring coplanar regions associated with a common surface. A region may be considered a neighbor to another when the distance between them is less than a predefined threshold. In some implementations, the distance between the two regions is the minimum distance between the corresponding two sets of points and may be, in some implementation, calculated using a k-d tree. In some implementations, a region is represented in Equation 5 below, where $\hat{n}$ is the plane's unit normal and $\vec{r}_0$ is the position vector of point $p_0$ on the plane.

$$\hat{n} \cdot (\vec{r} - \vec{r}_0) = 0 \qquad \text{Equation 5}$$

The coplanar surface merger 414 may determine a point on the plane as the mass center of the points of the region using Equation 6.

$$p_0 = \frac{1}{k} \sum_{i=1}^{k} p_i \qquad \text{Equation 6}$$

The coplanar surface merger 414 may determine a mean squared error (MSE) of the region, which is the mean squared distance from the points to the plane using Equation 7.

$$MSE = \frac{1}{N} \sum_{j=1}^{N} \{ \hat{n} \cdot (\vec{r}_i - \vec{r}_0) \}^2 \qquad \text{Equation 7}$$

Merging a specific region with a larger and more (or most) appropriate neighboring region, changes the MSE less than for merging with other (e.g., less appropriate) regions.

Accordingly, in some implementations, the coplanar surface merger 414 may calculate the MSE for each region $R_i$ and its union with its neighbouring regions $R_i \cup R_j$. Then, the coplanar surface merger 414 may calculate the change in the MSE, e.g., using Equation 8.

$$DMSE = |MSE(R_i) - MSE(R_i \cup R_j)|, \forall R_{ij} \qquad \text{Equation 8}$$

The coplanar surface merger 414 may merge two neighboring regions with the least DMSE are merged, when the DMSE value satisfies (e.g., is less than) a predefined threshold. In some implementations, the coplanar surface merger 414 may repeat the above processes to determine whether any additional neighboring regions should be merged with the newly merged, composite, region. In some implementations, the coplanar surface merger 414 may repeat until there are no further neighboring regions or merging with a neighboring region results in a DMSE value that does not satisfy (e.g., exceeds) the predefined threshold.

Figure 4B:
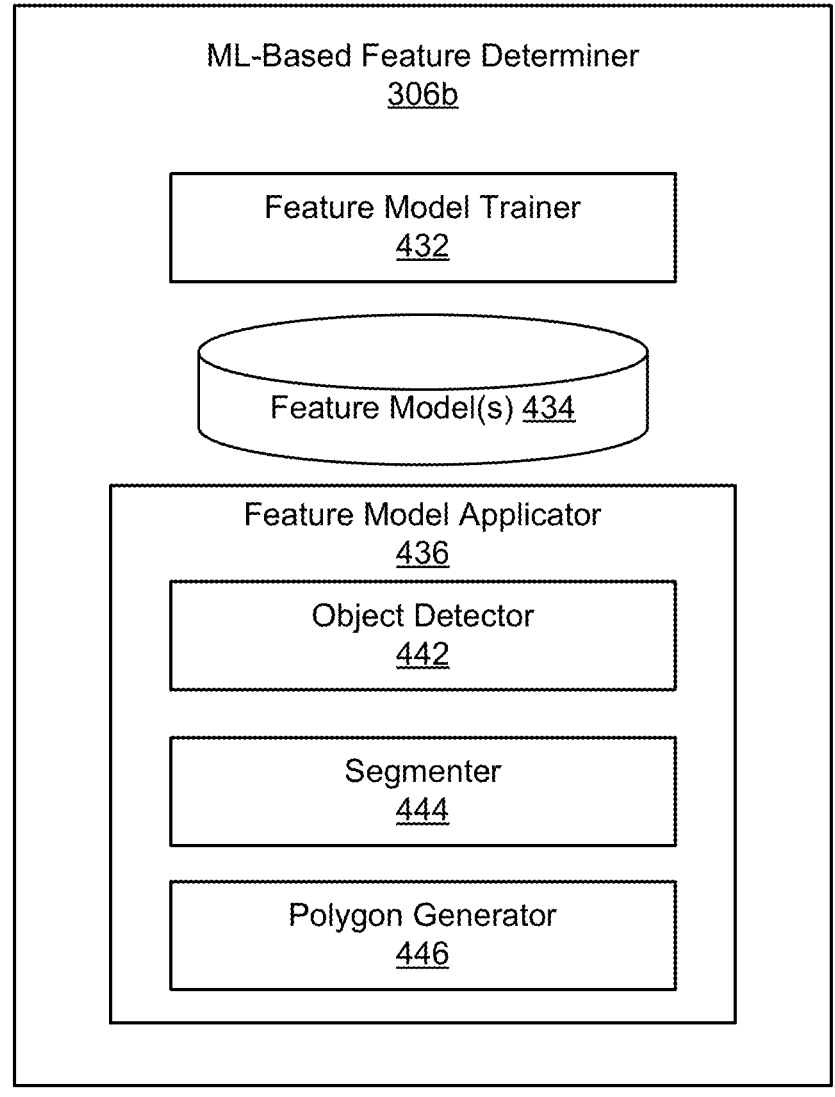
FIG. 4B is a block diagram of an example machine learning-based 3D feature determiner in accordance with some implementations.

Referring now to FIG. 4B, a block diagram of an example machine learning (ML) based feature determiner 306b is illustrated in accordance with some implementations. In the illustrated implementation of FIG. 4B, the ML-based feature determiner 306b includes a feature model trainer 432, feature model(s) 434, and a feature model applicator 436. In some implementations, the feature model applicator 436 includes an object detector 442, a segmenter 444, and a polygon generator 446.

In some implementations, one or more of the components 432, 434, and 436, and subcomponents 442, 444, and 446, of the ML-based feature determiner 306b may be communicatively coupled to one another to pass data and information to provide the features and functionality described below. In some implementations, one or more of the components 432, 434, and 436, and subcomponents 442, 444, and 446, of the ML-based feature determiner 306b may store the data and information to provide the features and functionality described below in memory 204 (or any other non-transitory storage medium communicatively accessible) for retrieval by one or more of the other components 432, 434, and 436, and subcomponents 442, 444, and 446, of the ML-based feature determiner 306b by accessing the memory 204 (or other non-transitory storage medium).

The feature model trainer 432 trains one or more machine learning feature model(s) 434 applied by the feature model applicator 436. In some implementations, the feature model(s) 434 include an object detection model (not shown) and a segmentation model (not shown). Depending on the implementation, training may include training of the algorithm(s) to create the feature learning model(s) 434, validation of the feature learning model(s) 434, or a combination of both.

The varieties of supervised, semi-supervised, unsupervised, reinforcement learning, topic modeling, dimensionality reduction, meta-learning and deep learning machine learning algorithms, which may be used to generate the feature model(s) 434 described herein, are so numerous as to defy a complete list. Example algorithms include, but are not limited to, a decision tree; a gradient boosted tree, gradient boosted machine; boosted stumps; a random forest; a support vector machine; a neural network; logistic regression (with regularization), linear regression (with regularization); stacking; a Markov model; support vector machines; and others.

In some implementations, the feature model trainer 432 trains the feature model(s) 434 using deep learning. However, it should be recognized that the disclosure herein is not limited to implementations using a deep learning and the feature model(s) 434 may use other artificial intelligence algorithms. It should further be recognized that the feature model(s) 434 may include more than one model (e.g., a separate object detection model and a separate segmentation model) and those models are not necessarily based on the same machine learning algorithm or type of machine learning algorithm. In some implementations, the feature model(s) are trained on and applied to DSM images.

In some implementations, the feature model trainer 432 passes the feature model(s) 434 to the feature model applicator 436. For example, the feature model trainer 432 is communicatively coupled to feature model applicator 436 to send the feature model(s) 434. In another implementation, the feature model trainer 432 stores the feature model(s) 434 in memory 204 (or any other non-transitory storage medium communicatively accessible), and the feature model applicator 436 may retrieve the feature model(s) 434 by accessing the memory 204 (or other non-transitory storage medium).

The feature model applicator 436 applies the feature model(s) 434 to a DSM image to generate a 3D representation of the feature. In the illustrated implementation, the feature model applicator 436 includes an object detector 442, a segmenter 444, and a polygon generator 446.

The object detector 442 applies an object detection model to the DSM image to detect a presence of a features (e.g., a facet) and applies bounding boxes around the detected features. For example, when a structure has seven roof facets, the object detector 442 may, in some implementations, individually detect and enclose in a bounding box each of the seven roof facets. In some implementations, the feature model(s) 434 includes an object detection model.

In some implementations, the object detector 442 passes a bounding box and bounded portion of the DSM image to the segmenter 444. For example, the object detector 442 is communicatively coupled to the segmenter 444 to send the bounding box and bounded portion of the DSM image. In another implementation, the object detector 442 stores the bounding box and bounded portion of the DSM image in memory 204 (or any other non-transitory storage medium communicatively accessible), and the segmenter 444 may retrieve the bounding box and bounded portion of the DSM image by accessing the memory 204 (or other non-transitory storage medium).

The segmenter 444 receives a bounding box generated by the object detector 442 and segments the feature within the bounding box from its surrounding within the bounded portion of the DSM image. In some implementations, the segmenter 444 generates an object mask for the feature, that separates the pixels associated with the feature (i.e., the detected object, such as a roof facet) from pixels associated with the feature's surrounding.

In some implementations, the segmenter 444 generates object masks representing a mutually exclusive feature set. In other words, in some implementations, the segmenter 444 enforces mutual exclusivity of features so that a point (or pixel) may be associated with, at most, one feature (e.g., one facet).

In some implementations, the segmenter 444 generates a probability mask associated with each detected feature from each of the bounding boxes generated by the object detector, and a point (or pixel) associated with more than one feature is assigned to the feature having the highest probability associated with the point (or pixel) in the probability mask. In some implementations, a feature is associated with a confidence level and when two features overlap a cut is performed and the overlapping portion is removed from the lower confidence feature.

In some implementations, the segmenter 444 passes the object mask to the polygon generator 436. For example, the segmenter 444 is communicatively coupled to polygon generator 436 to send the object mask. In another implementation, the segmenter 444 stores the object mask in memory 204 (or any other non-transitory storage medium communicatively accessible), and the polygon generator 436 may retrieve the object mask by accessing the memory 204 (or other non-transitory storage medium).

The polygon generator 436 obtains the object mask generated by the segmenter 444 and generates a set of one or more 3D polygons by combining the mask with elevation data from the DSM image.

In some implementations, the polygon generator 436 passes the set of one or more 3D polygons to one or more components, e.g., 308 and/or 312, of the 3D feature determiner 220. For example, the polygon generator 436 is communicatively coupled to feature representation optimizer 308 to send the set of one or more 3D polygons for representation optimization. As another example, the polygon generator 436 is communicatively coupled to metric determiner 312 to send the set of one or more 3D polygons for a determination of one or more associated metrics. In another implementation, the polygon generator 436 stores the set of one or more 3D polygons in memory 204 (or any other non-transitory storage medium communicatively accessible), and the one or more components, e.g., 308 and/or 312, of the 3D feature determiner 220 may retrieve the set of one or more 3D polygons by accessing the memory 204 (or other non-transitory storage medium).

Referring again to FIG. 3, the feature representation optimizer 308 receives the one or more 3D features (e.g., 3D polygons describing roof facets) determined by the feature determiner 306 and optimizes the representation of the one or more features. Continuing with the example in which the one or more facets are features, the facets determined by the feature determiner 306 may each be known in 3D as a set of polygon-connected points that, in general, are not necessarily flat (i.e., on the same plane) nor are they necessarily connected to any other facet. Actual facets on a 3D roof (simulated or real world) are connected to other facets in a geometrically constrained manner. The feature representation optimizer 308 determines an optimal representation of the facets, which more closely represents actual, real-world (or simulated) facets.

In some implementations, the feature representation optimizer 308 processes the "raw" facets from the feature determiner 306 by flattening each facet to a determined, best fitting plane through their polygon representation, determining intersection lines with any other facet(s) of the building, simplifying the geometry of multiple facet intersection points on roof, trimming exterior edges of facets to match knowledge of the structure outline, and, optionally, dealing with removal and annealing of artifacts from vegetation, overhang, and shadows on roof structure.

In some implementations, the feature determiner 306 obtains the structure outline generated by the structure and vegetation outliner 304 using a non-DSM image and cuts and removes a portion of the 3D polygon generated by the feature determiner 306 which extends outside the structure outline.

Figure 12:
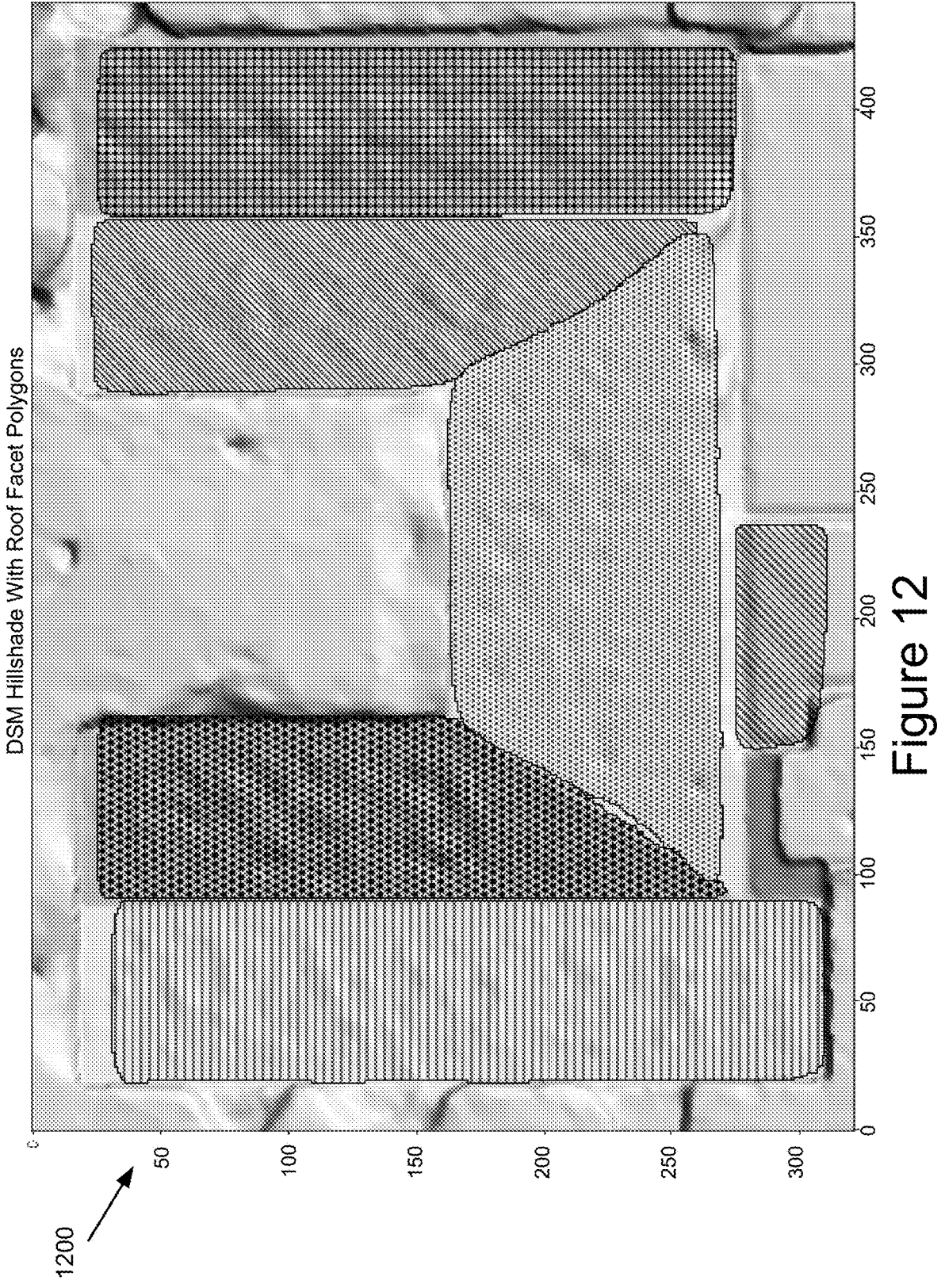
FIG. 12 illustrates an example of 3D polygons associated with determined features in accordance with some implementations.

In some implementations, a raw facet may not be planar (e.g., because of noise in the DSM image). For example, referring to FIG. 12, which illustrates a set of 3D polygons associated with determined features in accordance with some implementations, each polygon is represented using a different shading effect and is depicted overlaid on the DSM image. In FIG. 12, the DSM image beneath the polygons may be seen to have a wrinkled texture due to noise in the DSM image. In some implementations, the feature representation optimizer may determine a plane of best fit to represent the facet as a smooth plane. For example, in some implementations, the feature representation optimizer applies a ransack plane fitting model that uses random sample consensus with singular value decomposition plane fitting of the points, such an approach may be more robust to outliers. Since a roof facet may often be over-hanged or intersected by vegetation (e.g., an overhanging tree), the robustness may beneficially result in a smoother and more continuous plane representing the facet and annealing artifacts from overhanging vegetation and shadows.

In some implementations and use cases, the features alone (e.g., the roof facets alone) may be of interest, while in other implementations and use cases the relation between the features and the ground surface may be of interest. For example, building height may be of interest in some implementations and use cases, and knowing the elevation of the ground relative to the feature(s) may be useful for calculating information such as the building height.

The ground surface estimator 310 estimates the ground surface. In some implementations, the ground surface estimator 310 receives the DSM image as an input. In some implementations, the ground surface estimator 310 receives a mask describing buildings and vegetation, since structures and vegetation are not the ground. In some implementations, the mask is based on the structure and vegetation outlines determined by the structure and vegetation outliner 304. In some implementations, the ground surface estimator 310 dilates the mask to account for the possibility that the mask is imprecise around the edges of objects (e.g., the buildings and vegetation).

In some implementations, the ground surface estimator 310 may then perform a minimum pooling operation with a stride equal to the size of the pooling kernel. In some implementations, the value of the min pool is extracted as well as the location of the value. In some implementations, the ground surface estimator 310 may linearly interpolate the minimum pooled values (excluding the masked region), back to a regular grid with the same dimensions as the DSM.

In some implementations, the ground surface estimator 310 may add a predefined bias value to the DEM to account for the possibility that the minimum pooling operation may underestimate the true ground surface.

The metric determiner 312 determines one or more metrics associated with the one or more features determined by the feature determiner 306 or as optimized by the feature representation optimizer 308. Continuing the examples where the feature is a roof facet, examples of metrics determined by the metric determiner 312 may include one or more of a surface area of the facet, a pitch angle of the facet, a total number of facets, a truss size, a total roof area, a minimum roof height, a maximum roof height, an average roof height, number of stories, a building footprint, polygon points for facet boundary in 3D, lines of intersection with other facet(s), etc.

In some implementations, the roof facets are represented as $\mathbb{R}$ 3 geojson polygons. In some implementations, the metric determiner 312 may determine a facet count as a total number of facets, applying a minimum facet size allowed to facet candidates. In some implementations, the metric determiner 312 may determine a roof area as the total area of the roof facets (e.g., in square meters or square feet). In some implementations, the metric determiner 312 may determine an average roof pitch. In some implementations, the metric determiner 312 may determine an average pitch of each roof facet, weighted by the area of the facet using Equation 9.

$$A_{total} = \sum_{i=1}^{N_{Facets}} A_i \qquad \text{Equation 9}$$

$$\theta_{avg} = \sum_{i=1}^{N_{Facets}} \frac{A_i}{A_{total}} \theta_i$$

The pitch of an individual facet may be represented as the angle between the facet normal and vertical (the z unit vector (0, 0, 1)); this is equivalent to the angle between the facet and the horizontal plane. In some implementations, the facet pitch angle is always positive and less than 90 degrees.

Figure 13:
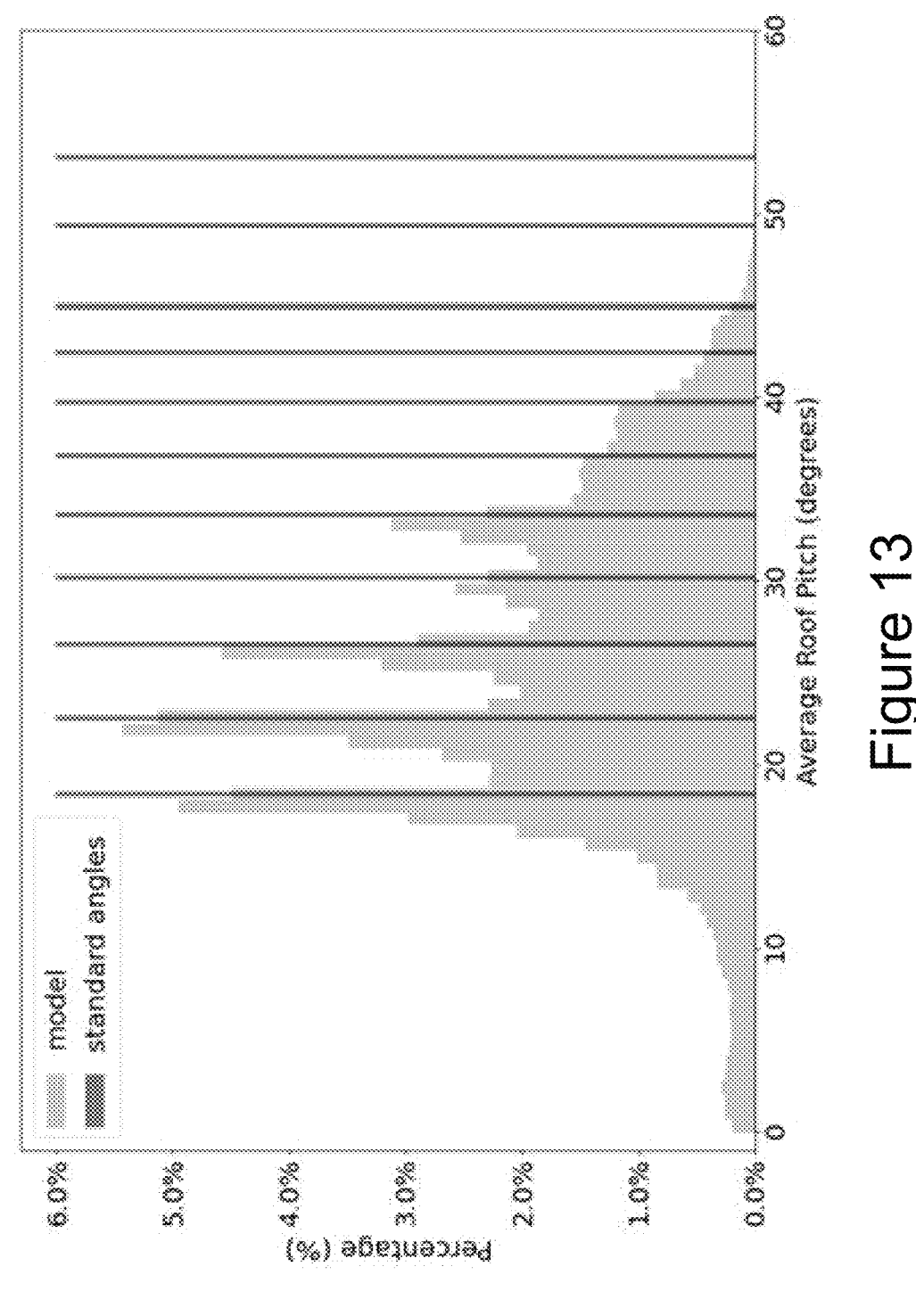
FIG. 13 illustrates an example distribution of average pitch angles in accordance with some implementations.
Figure 14:
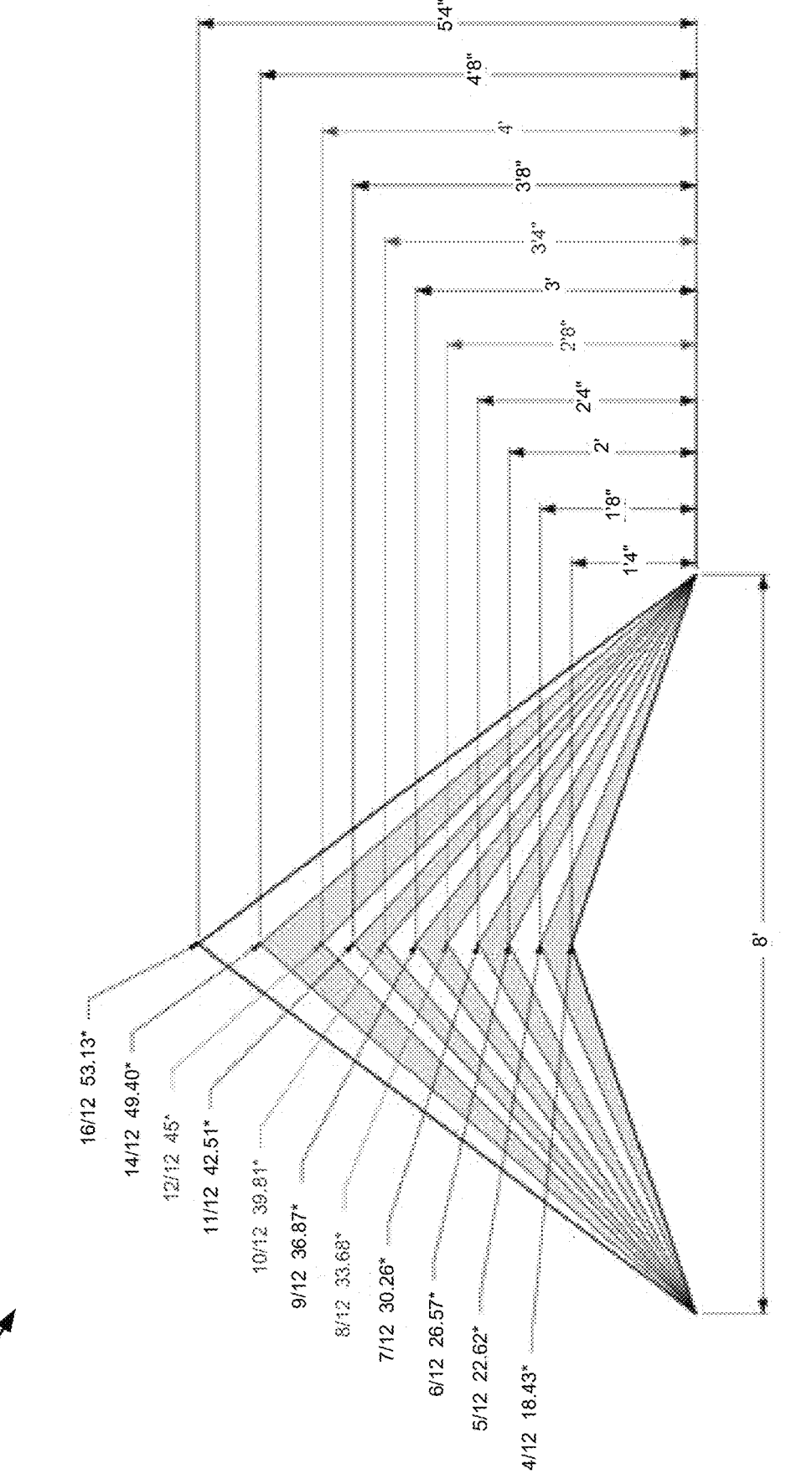
FIG. 14 is an illustration of examples of common residential trusses and associated metrics according to some implementations.

In some implementations, the metric determiner 312 is calibrated based on a large set of houses. For example, referring now to FIG. 13, a distribution of determined pitch angles and a percentage of the set of houses associated with the determined pitch angle. Also marked, by vertical lines, are pitch angles associated with common residential roof truss sizes, which are illustrated in FIG. 14. It should be recognized, that the peaks in the distribution of FIG. 13 correspond to the lines associated with the pitch angles associated with the common residential roof truss sizes, which allows calibration and validation of the pitch angles determined by the metric determiner 312.

In some implementations, the metric determiner 312 determines an average roof height. In some implementations, the metric determiner 312 obtains the average elevation of each roof facet and sums of the elevations of each roof facet weighted by the area of the associated facet. In some implementations, the metric determiner 312 may then subtract the average elevation of the DEM (at the building) from that weighted-by-facet-area average elevation to obtain the average roof height (above grade).

In some implementations, the metric determiner 312 determines a maximum roof height by first calculating a maximum elevation on the roof as a maximum elevation of the roof facet points, then subtracting the elevation of the DEM from this value to determine the maximum roof height above grade.

In some implementations, the metric determiner 312 determines a number of stories as the max roof height divided by a story height (10 ft), then applying an integer. This may produce a conservative estimate for the number of building stories.

In some implementations, the metric determiner 312 determines a building footprint as a ground area (e.g., in square meters and/or square feet) that the building occupies.

The determination engine 314 may make one or more determinations. The type of determination may vary based on the implementation and use case. The variation in features, use cases, industries, etc. are so numerous as to provide a complete listing of example determinations. However, examples of determinations in an insurance context, where the feature is a roof facet, may include, but are not limited to, one or more of an insurance claim response, a replacement cost, an insurance premium, whether to provide or decline coverage, etc. Examples of determinations in a contractor context, where the feature is a roof facet, may include, but are not limited to, one or more of an estimated square footage, an estimated amount of materials, an estimated cost of materials, etc. It should be recognized that the foregoing are merely examples of decisions provided for clarity and convenience, and other decisions are within the scope of this disclosure.

The simulator 316 may generate one or more simulations. Depending on the implementation, the one or more simulations may be used to generate training and/or test data, validate one or more models, and provide a 3D model of the determined feature(s).

In some implementations, the simulator 316 generates a 3D model based on the features determined by the feature determiner 306 and, optionally, optimized by the feature representation optimizer 308, and the estimated ground surface, from the ground surface estimator 310, and presents the 3D model of the building for display to a user.

In some implementations, the simulator 316 may generate training and/or test data, which may also be referred to as validation data, based on a simulation. For example, in some implementations, the simulator 316 generates a 3D simulation that includes a 3D model of vegetation and structures. In some implementations, the simulator 316 generates one or more of simulated DSM images and simulated non-DSM images based on the simulated vegetation and structures. In some implementations, the simulated non-DSM image data generated from the simulation may be automatically machine-labeled with vegetation and/or building outlines to provide labeled training data for training the vegetation model and/or structure model with a supervised machine learning.

In some implementations, a simulation generated and maintained by the simulator 316 may be used to validate or optimize performance of the 3D feature determiner 220 or one or more of its subcomponents. For example, the structure and vegetation outliner 304 may be provided a non-DSM image generated from the simulation, and the building and/or vegetation outlines generated by the structure and vegetation outliner 304 and compared to an expected outline in the simulation to evaluate an accuracy of the structure model and/or vegetation model. In another example, the features determined by the feature determiner 306 and/or optimized by the feature representation optimizer 308 may be compared to the corresponding features present in the simulation to validate the performance of the feature determiner 306 and/or the feature representation optimizer 308. In yet another example, the ground surface estimated by the ground surface estimator 310 may be compared to the ground surface in the simulation to determine performance. In still another example, one or more metrics determined by the metric determiner 312 may be compared to the metrics in the simulator (e.g., comparing the determined total roof surface area to the total roof surface area of the roof in the simulation). In still yet another example, the simulator 316 may generate a 3D model based on the features, as determined by the feature determiner 306 and optionally optimized by the feature representation optimizer 308, and the estimated ground surface, from the ground surface estimator 310, and compare the generated 3D model to that of the corresponding structure in the simulation on which the 3D model is based.

Depending on the implementation, one or more a raw feature set, an optimized feature set, a derived metric, a determination, and a 3D model generated based on the detected features may be presented to a user, e.g., via a user interface presented on a client device or in a report (e.g., a printed or pdf report).

Example Methods

FIGS. 5-8 are flowcharts of example methods that may, in accordance with some implementations, be performed by the systems described above with reference to FIGS. 1-4B. The methods FIGS. 5-8 are provided for illustrative purposes, and it should be understood that many variations exist and are within the scope of the disclosure herein.

Figure 5:
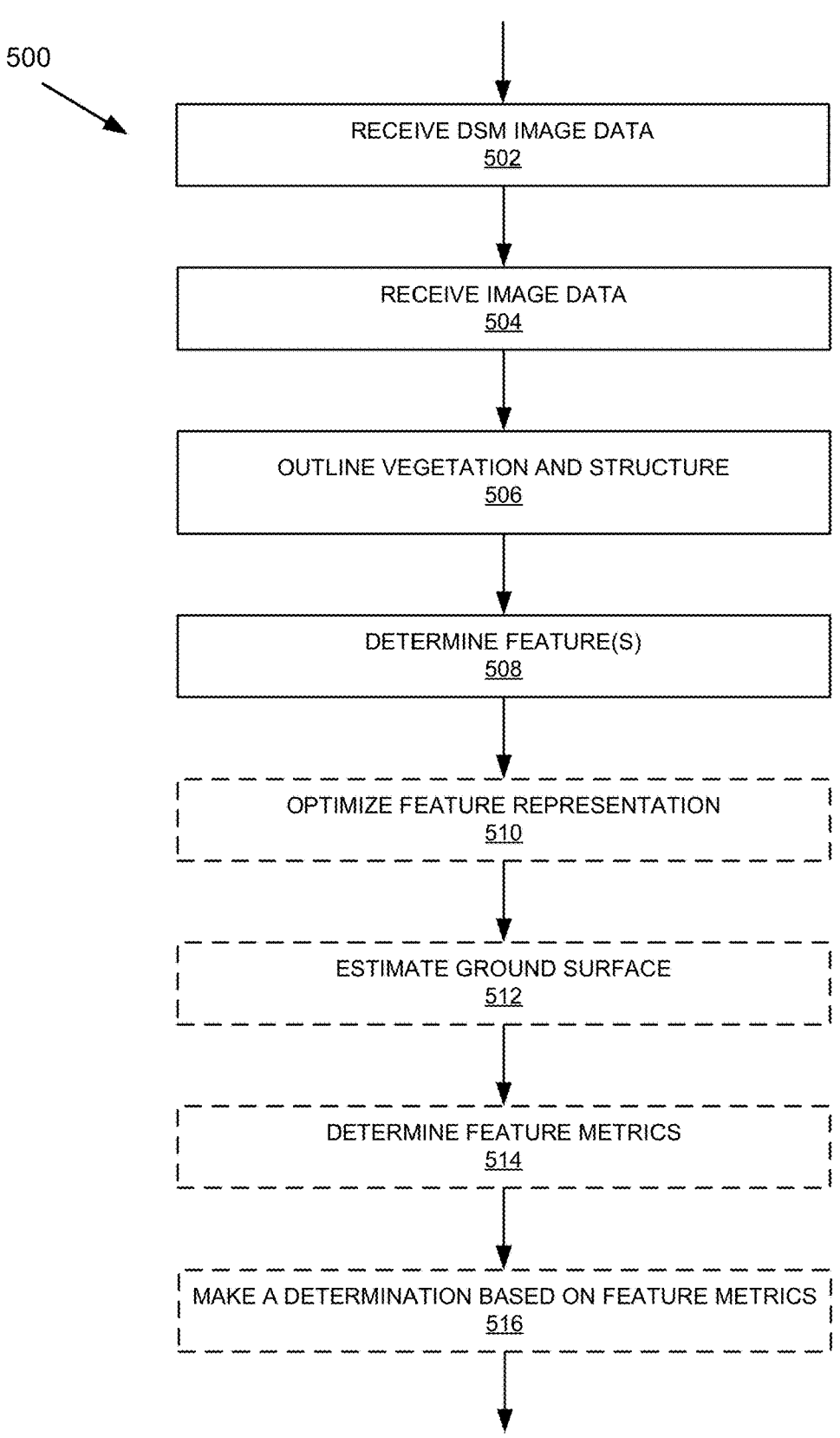
FIG. 5 is a flowchart of an example method for determining 3D structure features from DSM data in accordance with some implementations.

FIG. 5 is a flowchart of an example method 500 for determining 3D structure features from DSM data in accordance with some implementations. At block 502, the DSM receiver 322 receives DSM image data. At block 504, the non-DSM image receiver 324 receives a non-DSM image. At block 506, the structure and vegetation outliner 304 generates outline of the vegetation and the structure(s). At block 508, the feature determiner 306 determines one or more features associated with the structure.

One or more of blocks 510-516 may be optional depending on the implementation. At block 510, the feature representation optimizer 308 optimizes the representation of one or more of the features determined at block 508. At block 512, the ground surface estimator 310 estimates the ground surface. At block 514, the metric determiner 312 determines one or more metrics associated with one or more of the features determined at block 508. At block 516, the determination engine 314 makes a determination based on one or more of the metrics determined at block 514.

Figure 6A:
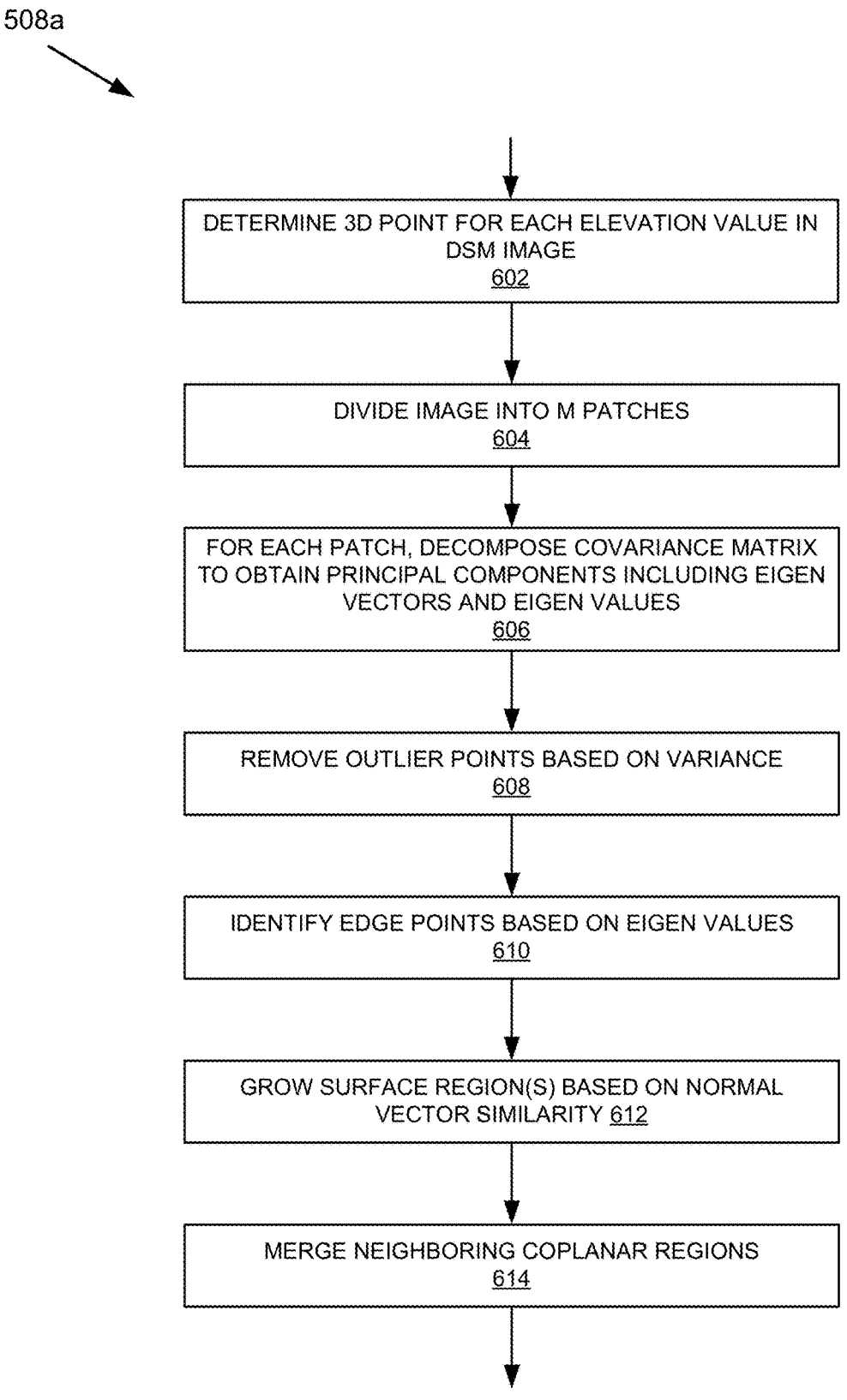
FIG. 6A is a flowchart of an example method for determining 3D structure features from DSM data based on rules in accordance with some implementations.

FIG. 6A is a flowchart of an example method 508a for determining 3D structure features from DSM data based on rules in accordance with some implementations. At block 602, the 3D point determiner 402 determines a 3D point for each elevation value in the DSM image. At block 604, the image divider 404 divides the image into m patches. At block 606, the component determiner 406, for each patch, decomposes a covariance matrix to obtain principal components including singular vectors and singular values. At block 608, the outlier identifier removes points based on variance. At block 610, the edge determiner 410 identifies edge points based on singular values. At block 612, the surface region determiner 412 grows surface region(s) based on normal vector similarity. At block 614, the coplanar surface merger 414 merges neighboring coplanar regions.

Figure 6B:
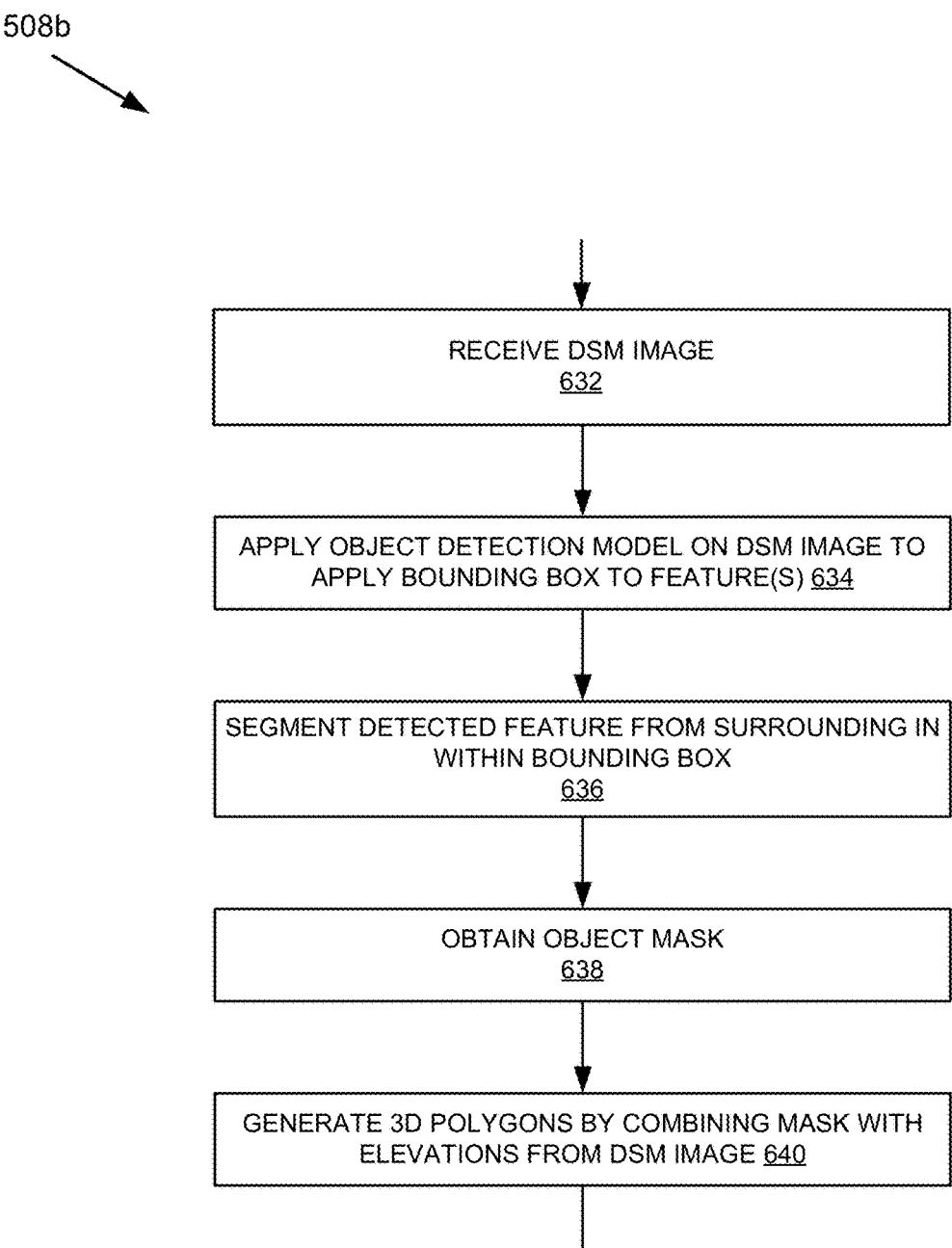
FIG. 6B is a flowchart of an example method for determining 3D structure features from DSM data based on machine learning in accordance with some implementations.

FIG. 6B is a flowchart of an example method 508b for determining 3D structure features from DSM data based on machine learning in accordance with some implementations. At block 632, the object detector 442 receives a DSM image. At block 634, the object detector 442 applies an object detection model to the DSM image received at block 632 to apply a bounding box to the feature(s). At block 636, the segmenter 444 segments the detected feature(s) from the surrounding within the bounding box. At block 638, the polygon generator 436 obtains an object mask. At block 640, the polygon generator 436 generates 3D polygons by combining the mask with elevations from the DSM image.

Figure 7:
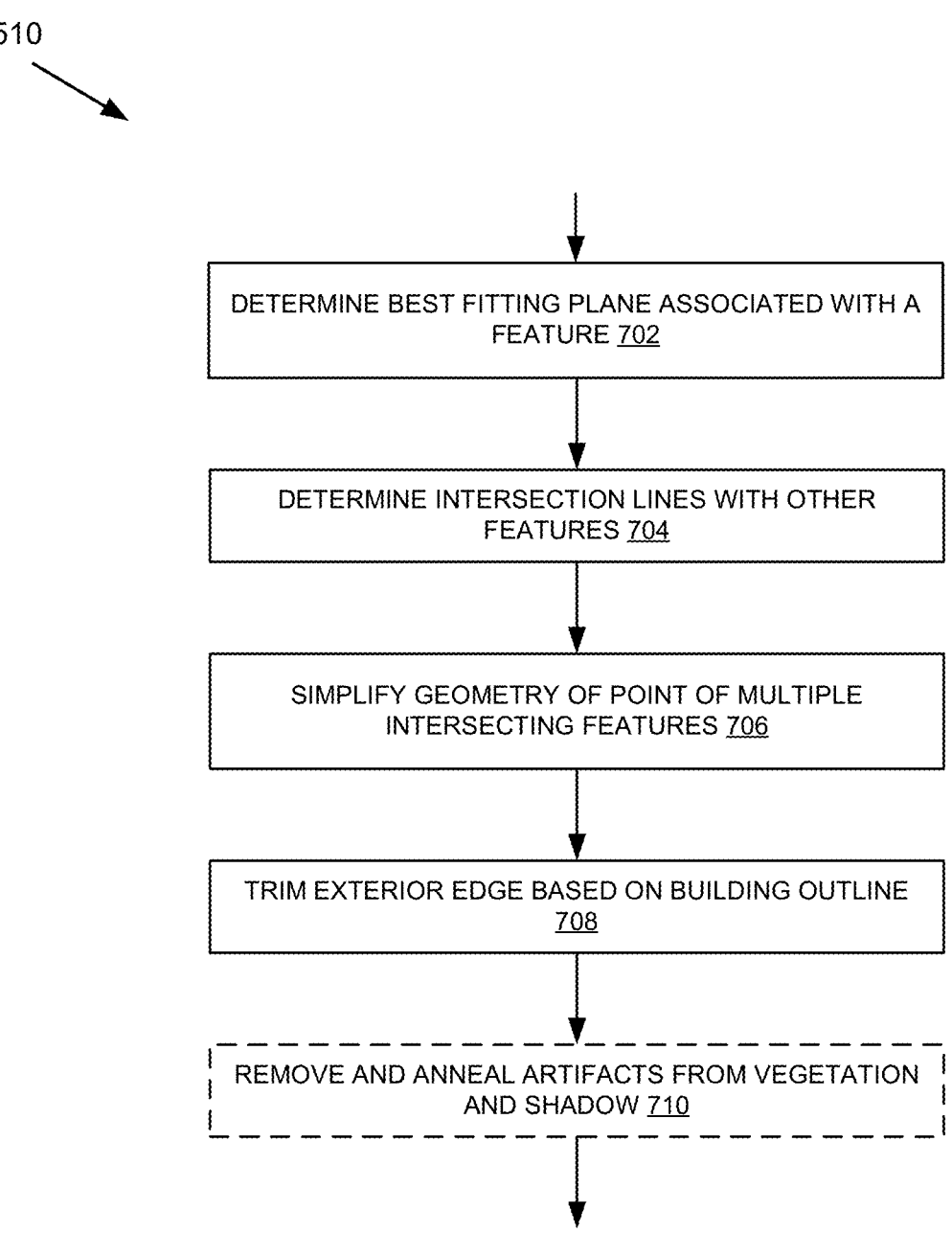
FIG. 7 is a flowchart of an example method for optimizing feature representation in accordance with some implementations.

FIG. 7 is a flowchart of an example method 510 for optimizing feature representation in accordance with some implementations. At block 702, the feature representation optimizer 308 determines a best fitting plane associated with a feature. At block 704, the feature representation optimizer 308 determines an intersection with other features. At block 706, the feature representation optimizer 308 simplifies a geometry of a point of one or more intersecting features. At block 708, the feature representation optimizer 308 trims an exterior edge of a feature based on a building outline. At block 710, which is optional in some implementations, the feature representation optimizer 308 removes and anneals artifacts from vegetation and shadow.

Figure 8:
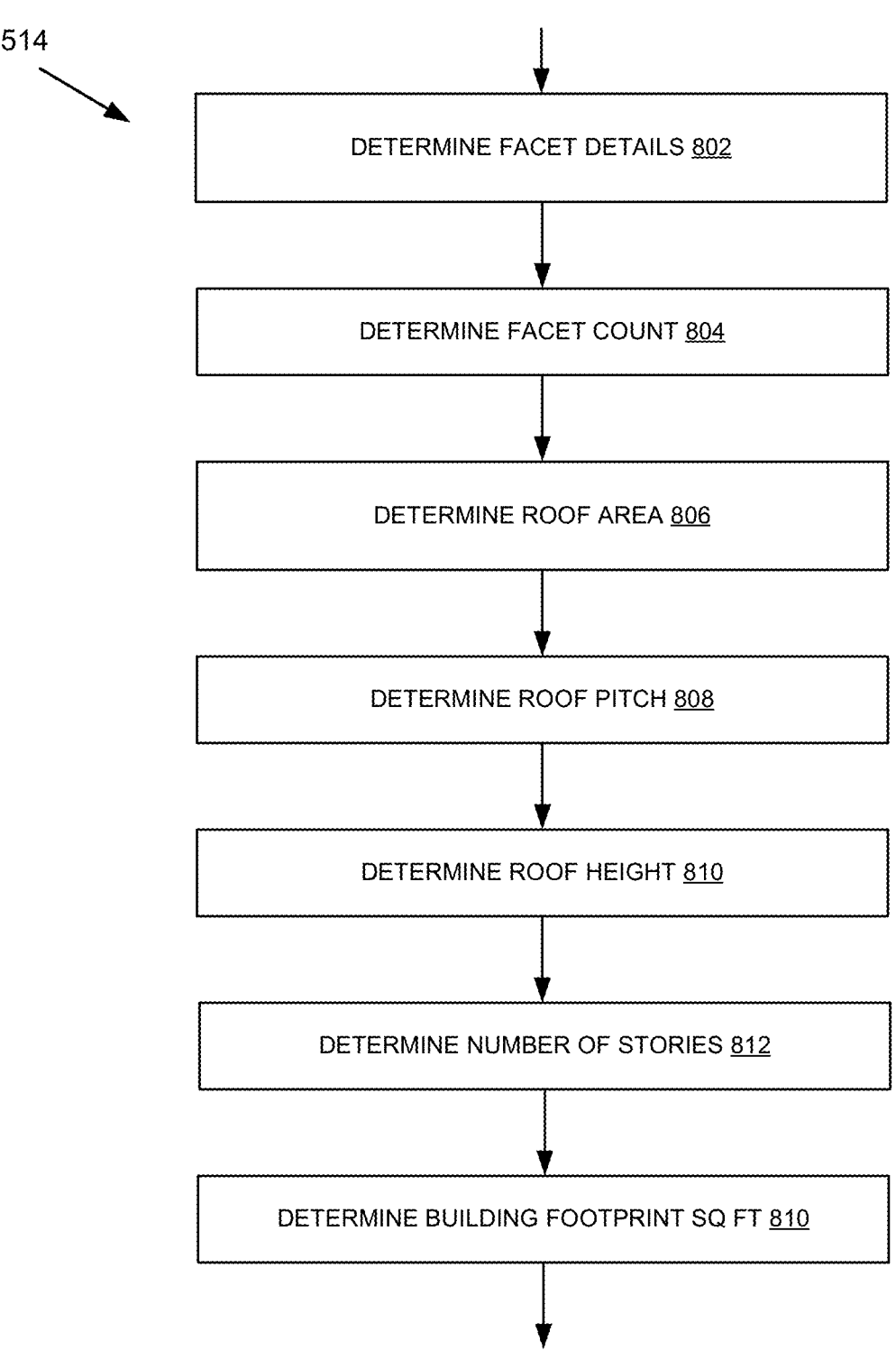
FIG. 8 is a flowchart of an example method for determining feature metrics in accordance with some implementations.

FIG. 8 is a flowchart of an example method 514 for determining feature metrics in accordance with some implementations. A block 802, the metric determiner 312 determines facet details. At block 804, the metric determiner 312 determines a facet count. At block 806, the metric determiner 312 determines a roof area. At block 808, the metric determiner 312 determines a roof pitch. At block 810, the metric determiner 312 determines a roof height. At block 812, the metric determiner 312 determines a number of stories. At block 814, the metric determiner 312 determines a building footprint square footage.

Other Considerations

It should be understood that the above-described examples are provided by way of illustration and not limitation and that numerous additional use cases are contemplated and encompassed by the present disclosure. In the above description, for purposes of explanation, numerous specific details are set forth in order to provide a thorough understanding of the present disclosure. However, it should be understood that the technology described herein may be practiced without these specific details. Further, various systems, devices, and structures are shown in block diagram form in order to avoid obscuring the description. For instance, various implementations are described as having particular hardware, software, and user interfaces. However, the present disclosure applies to any type of computing device that can receive data and commands, and to any peripheral devices providing services.

Reference in the specification to "one implementation" or "an implementation" or "some implementations" means that a particular feature, structure, or characteristic described in connection with the implementation is included in at least one implementation. The appearances of the phrase "in some implementations" in various places in the specification are not necessarily referring to the same implementations.

In some instances, various implementations may be presented herein in terms of algorithms and symbolic representations of operations on data bits within a computer memory. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like.

It should be borne in mind, however, that these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present disclosure also relates to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic optical disks, read-only memories (ROMs), random access memories (RAMs), EPROMs, EEPROMs, magnetic or optical cards, or any type of media suitable for storing electronic instructions, each coupled to a computer system bus.

The disclosure can take the form of an entirely hardware implementation, an entirely software implementation or an implementation containing both hardware and software elements. In a preferred implementation, the disclosure is implemented in software, which includes but is not limited to firmware, resident software, microcode, etc.

Furthermore, the disclosure can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid-state memory, magnetic tape, a removable computer diskette, a random-access memory (RAM), a read-only memory (ROM), a flash memory, a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution. Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the present disclosure is described with reference to a particular programming language. It will be appreciated that a variety of programming languages may be used to implement the teachings of the disclosure as described herein.

What is claimed is:
1. A computer implemented method comprising:
   receiving, using one or more processors, a digital surface model (DSM) image;

receiving, using the one or more processors, a non-DSM image;

outlining, using the one or more processors, a structure in the non-DSM image;

dividing, using the one or more processors, the DSM image into a set of patches, wherein a patch defines a local neighborhood of points;

for each patch in the set of patches including a first patch, decomposing, using the one or more processors, a covariance matrix to obtain a set of principal components associated with that patch and including a vector and a scalar, the set of principal components associated with the first patch including a first vector and a first scalar value associated with a first point in the first patch;

approximating, using the one or more processors, a first normal vector perpendicular to a plane fitted through a first local set of points comprising the first patch based on the first vector, wherein the first vector is associated with the first scalar value and the first scalar value has a least value;

growing, using the one or more processors, a surface region by merging the first patch and a second patch based on a similarity between the first normal vector associated with the first patch and a second normal vector associated with the second patch, wherein the surface region is associated with a first feature; and denoising, using the one or more processors, DSM image data associated with the surface region associated with the first feature, wherein the denoising of the DSM image data includes determining a plane of best fit to represent the surface region as a smooth plane, thereby reducing noise associated with the surface region in the DSM image data.

2. The computer implemented method of claim 1, wherein the DSM image is selected from one or more of a simulated DSM image, a non-simulated DSM image, and a combination of simulated and non-simulated DSM data.

3. The computer implemented method of claim 1, wherein the non-DSM image is a two-dimensional orthographic projection from a true nadir perspective and aligned with the DSM image.

4. The computer implemented method of claim 1 further comprising:

outlining, using the one or more processors, vegetation in the non-DSM image.

5. The computer implemented method of claim 4 comprising:

generating, using the non-DSM image and the DSM image, an outline of one or more structures in the non-DSM image; and generating, using the non-DSM image and the DSM image, an outline of vegetation in the non-DSM image.

6. The computer implemented method of claim 5 comprising optimizing a representation of a set of features including:

determining a plane of best fit associated with the first feature, the set of features including the first feature and a second feature;

determining a line where the first feature intersects the second feature;

simplifying a geometry at a point of multiple intersecting features; and trimming the set of features to remove a portion of a first feature extending beyond an outline of a first structure, the outline of the first structure included in the outline of one or more structures.

7. The computer implemented method of claim 1, wherein the first feature is one of a set of features that includes a set of roof facets, the method further comprising:

determining a set of metrics describing the set of roof facets, the set of metrics including one or more of a metric describing the set of roof facets and a metric describing an individual facet, wherein the metric describing the set of roof facets includes one or more of total number of roof facets, a total surface area of a roof, an average roof height, a number of stories, and a building footprint, and wherein the metric describing an individual facet includes one or more of a surface area associated with the individual facet and a roof pitch associated with the individual facet.

8. The computer implemented method of claim 1, wherein the similarity between the first normal vector and the second normal vector is based on an angle between the first normal vector and the second normal vector being less than a predefined threshold.

9. The computer implemented method of claim 1, wherein the first vector is a singular vector and the first scalar value is a singular scalar.

10. The computer implemented method of claim 1 further comprising:

removing a first outlier point from the first patch based on a variance associated with the first outlier point satisfying a threshold.

11. The computer implemented method of claim 1, wherein a neighborhood of points associated with the first patch includes points from different adjacent surfaces, wherein the set of principle components includes a second vector and a second scalar value associated with a second point in the first patch, the method further comprising:

determining whether the second scalar value associated with the second point satisfies a condition; and adding the second point to a facet based on satisfaction of the condition.

12. The computer implemented method of claim 1, the method further comprising:

calculating a resulting change in a mean squared error when the surface region is merged with a neighboring surface region;

determining that the resulting change in the mean squared error satisfies a threshold; and merging the surface region with a neighboring surface region as co-planar surfaces.

13. A system comprising:

a processor; and a memory, the memory storing instructions that, when executed by the processor, cause the system to:

receive a digital surface model (DSM) image;

receive a non-DSM image;

outline a structure in the non-DSM image;

divide the DSM image into a set of patches, wherein a patch defines a local neighborhood of points;

for each patch in the set of patches including a first patch, decompose a covariance matrix to obtain a set of principal components associated with that patch and including a vector and a scalar, the set of principal components associated with the first patch including a first vector and a first scalar value associated with a first point in the first patch;

approximate a first normal vector perpendicular to a plane fitted through a first local set of points comprising the first patch based on the first vector, wherein the first vector is associated with the first scalar value and the first scalar value has a least value;

grow a surface region by merging the first patch and a second patch based on a similarity between the first normal vector associated with the first patch and a second normal vector associated with the second patch, wherein the surface region is associated with a first feature; and denoise DSM image data associated with the surface region associated with the first feature, wherein denoising the DSM image data includes determining a plane of best fit to represent the surface region as a smooth plane, thereby reducing noise associated with the surface region in the DSM image data.

14. The system of claim 13, wherein the DSM image is selected from one or more of a simulated DSM image, a non-simulated DSM image, and a combination of simulated and non-simulated DSM data.

15. The system of claim 13, wherein the non-DSM image is a two-dimensional orthographic projection from a true nadir perspective and aligned with the DSM image.

16. The system of claim 13, the memory further stores instructions that, when executed by the processor, cause the system to:

outline vegetation in the non-DSM image.

17. The system of claim 16 comprising:

generating, using the non-DSM image and the DSM image, an outline of one or more structures in the non-DSM image; and generating, using the non-DSM image and the DSM image, an outline of vegetation in the non-DSM image.

18. The system of claim 17, wherein the memory further stores instructions that, when executed by the processor, cause the system to optimize a representation of a set of features including:

determining a plane of best fit associated with the first feature, the set of features including the first feature and a second feature;

determining a line where the first feature intersects the second feature;

simplifying a geometry at a point of multiple intersecting features; and trimming the set of features to remove a portion of a first feature extending beyond an outline of a first structure, the outline of the first structure included in the outline of one or more structures.

19. The system of claim 13, wherein the first feature is one of a set of features that includes a set of roof facets, wherein the memory further stores instructions that, when executed by the processor, cause the system to:

determining a set of metrics describing the set of roof facets, the set of metrics including one or more of a metric describing the set of roof facets and a metric describing an individual facet, wherein the metric describing the set of roof facets includes one or more of total number of roof facets, a total surface area of a roof, an average roof height, a number of stories, and a building footprint, and wherein the metric describing an individual facet includes one or more of a surface area associated with the individual facet and a roof pitch associated with the individual facet.

20. The system of claim 13, wherein the similarity between the first normal vector and the second normal vector is based on an angle between the first normal vector and the second normal vector being less than a predefined threshold.

21. The system of claim 13, wherein the first vector is a singular vector and the first scalar value is a singular scalar.

22. The system of claim 13, wherein the memory further stores instructions that, when executed by the processor, cause the system to:

removing a first outlier point from the first patch based on a variance associated with the first outlier point satisfying a threshold.

23. The system of claim 13, wherein a neighborhood of points associated with the first patch includes points from different adjacent surfaces, wherein the set of principle components includes a second vector and a second scalar value associated with a second point in the first patch, and wherein the memory further stores instructions that, when executed by the processor, cause the system to:

determine whether the second scalar value associated with the second point satisfies a condition; and add the second point to a facet based on satisfaction of the condition.

24. The system of claim 13, wherein the memory further stores instructions that, when executed by the processor, cause the system to:

calculate a resulting change in a mean squared error when the surface region is merged with a neighboring surface region;

determine that the resulting change in the mean squared error satisfies a threshold; and merge the surface region with a neighboring surface region as co-planar surfaces.

* * * * *